United States Patent
Hashimoto

(10) Patent No.: US 11,073,725 B2
(45) Date of Patent: Jul. 27, 2021

(54) METHOD OF MANUFACTURING LIGHT EMITTING MODULE, AND LIGHT EMITTING MODULE

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 25 days.

(21) Appl. No.: 16/365,012

(22) Filed: Mar. 26, 2019

(65) Prior Publication Data
US 2019/0294004 A1    Sep. 26, 2019

(30) Foreign Application Priority Data

Mar. 26, 2018 (JP) .............................. JP2018-059064
Mar. 25, 2019 (JP) .............................. JP2019-056065

(51) Int. Cl.
| | | |
|---|---|---|
| G02F 1/13357 | (2006.01) | |
| H01L 25/075 | (2006.01) | |
| H01L 33/36 | (2010.01) | |
| H01L 33/50 | (2010.01) | |
| H01L 33/56 | (2010.01) | |

(Continued)

(52) U.S. Cl.
CPC .................. *G02F 1/133611* (2013.01); *G02F 1/133603* (2013.01); *G02F 1/133606* (2013.01); *H01L 25/0753* (2013.01); *H01L 33/36* (2013.01); *H01L 33/507* (2013.01); *H01L 33/56* (2013.01); *H01L 33/58* (2013.01); *H01L 33/62* (2013.01); *G02B 6/0021* (2013.01); *G02B 6/0023* (2013.01); *G02F 1/133601* (2021.01); *G02F 1/133607* (2021.01); *G02F 1/133612* (2021.01); *G02F 1/133614* (2021.01); *H01L 33/32* (2013.01); *H01L 2933/005* (2013.01); *H01L 2933/0041* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

| | | |
|---|---|---|
| 2007/0147073 A1 | 6/2007 | Sakai et al. |
| 2011/0149594 A1 | 6/2011 | Terajima et al. |

(Continued)

FOREIGN PATENT DOCUMENTS

| | | |
|---|---|---|
| JP | 2007018936 A | 1/2007 |
| JP | 2007188863 A | 7/2007 |

(Continued)

*Primary Examiner* — Moazzam Hossain
*Assistant Examiner* — Stanetta D Isaac
(74) *Attorney, Agent, or Firm* — Hunton Andrews Kurth LLP

(57) ABSTRACT

The method of manufacturing a light emitting module includes: providing a light guiding plate having a first main surface serving as a light emitting surface; and a second main surface positioned opposite to the first main surface and provided with a recess; providing a light adjustment portion containing a fluorescent material; providing a light emitting element unit in which a light emitting element comprising an electrode is integrally bonded to the light adjustment portion; bonding the light adjustment portion of the light emitting element unit to the recess; and forming wiring on the electrode of the light emitting element.

12 Claims, 11 Drawing Sheets

(51) Int. Cl.
*H01L 33/62* (2010.01)
*H01L 33/58* (2010.01)
*H01L 33/32* (2010.01)
*F21V 8/00* (2006.01)
*G02F 1/1335* (2006.01)

(56) References Cited

U.S. PATENT DOCUMENTS

| | | | |
|---|---|---|---|
| 2012/0257386 | A1 | 10/2012 | Harbers et al. |
| 2013/0039617 | A1 | 2/2013 | Illek et al. |
| 2014/0028953 | A1* | 1/2014 | Kubota ................ G02B 6/0073 349/62 |
| 2014/0042467 | A1 | 2/2014 | Livesay et al. |
| 2014/0319560 | A1 | 10/2014 | Tischler |
| 2015/0036317 | A1 | 2/2015 | Yamamoto et al. |
| 2017/0092825 | A1* | 3/2017 | Bando ................... H01L 33/507 |
| 2018/0095329 | A1 | 4/2018 | Shimizu |

FOREIGN PATENT DOCUMENTS

| | | | |
|---|---|---|---|
| JP | 2007227286 A | 9/2007 |
| JP | 2008205401 A | 9/2008 |
| JP | 2010008837 A | 1/2010 |
| JP | 2011210674 A | 10/2011 |
| JP | 2013527605 A | 6/2013 |
| JP | 2015032373 A | 2/2015 |
| JP | 2016115703 A | 6/2016 |
| JP | 2016533030 A | 10/2016 |
| JP | 2017069368 A | 4/2017 |
| WO | 2015013399 A1 | 1/2015 |
| WO | 2016/171109 A1 | 10/2016 |
| WO | 2017093248 A1 | 6/2017 |

* cited by examiner

METHOD OF MANUFACTURING LIGHT EMITTING MODULE, AND LIGHT EMITTING MODULE

CROSS-REFERENCE TO RELATED APPLICATION

This application claims priority to Japanese Patent Application No. 2018-059064, filed on Mar. 26, 2018, and Japanese Patent Application No. 2019-056065 filed on Mar. 25, 2019, the disclosures of which are hereby incorporated by reference in their entirety.

BACKGROUND

1. Field of the Invention

The present disclosure relates to a method of manufacturing a light emitting module, and a light emitting module.

2. Description of the Related Art

Light emitting devices using light emitting elements such as light emitting diodes are widely used as light sources of backlights for liquid crystal displays, and various light sources for displays.

For example, a light source device as disclosed in Japanese Patent Publication No. 2015-32373A includes a plurality of light emitting elements mounted on a mounting substrate, hemispherical lens members each encapsulating the light emitting elements, and a light diffusion member to which light from the light emitting elements enters, the light diffusion member being disposed on the hemispherical lens member.

Further, in a light source device as disclosed in Japanese Patent Publication No. 2016-115703A, a two-layer sheet obtained by integrating a encapsulating resin layer with a fluorescent material layer is bonded to the upper surface of a light emitting element, and the lateral surface of the light emitting element is covered with a reflecting resin.

However, in the light source device disclosed in JP2015-32373A, the distance between the mounting substrate and the diffusion plate should be greater than the thickness of the lens member, so that there is a possibility to fail sufficient thickness reduction. In addition, the light source device in JP2016-115703A cannot uniformly disperse and irradiate light from a plurality of light emitting elements, and thus cannot be used in applications which require light emission characteristics with little luminance non-uniformity.

The present disclosure is intended to provide a method of manufacturing a light emitting module, and a light emitting module, where the light emitting module is reduced in thickness, and is capable of uniform light emission with little luminance non-uniformity.

SUMMARY

A method of manufacturing a light emitting module according to one aspect of the present disclosure has providing a light guiding plate and a light emitting element unit. The light guiding plate has a first main surface serving as a light emitting surface, and a second main surface opposite to the first main surface. The second main surface defines a recess on it. The light emitting element unit has a light emitting element having a light emission surface and comprising an electrode, and a light adjustment portion containing a fluorescent material. The light emitting element is integrally bonded to the light adjustment portion. The method also has fixing the light emitting element unit to the light guiding plate by bonding the light adjustment portion to the recess, and forming wiring on the electrode of the light emitting element.

The method of manufacturing a light emitting module can provide a light emitting module including a light guiding plate and a light emitting element, the light emitting module attaining uniform light emission with little luminance non-uniformity while having a reduced thickness as a whole. This is because a light adjustment portion is bonded to a recess of the light guiding plate, and a light emitting element unit in which the light emitting element is bonded to the light adjustment portion is disposed at a predetermined position on the light guiding plate. Further, the method of manufacturing a light emitting module has such a feature that the light emitting element unit includes the fluorescent material-containing light adjustment portion and the light emitting element as an integral structure, and the light adjustment portion of the light emitting element unit is bonded to the recess of the light guiding plate to dispose the light emitting element unit at a predetermined position on the light guiding plate. The light emitting element unit is bonded at a predetermined position with high accuracy with less relative positional deviation of the light adjustment portion, the light emitting element and the recess of the light guiding plate, so that light emitting modules having a reduced thickness as a whole can be efficiently mass-produced, and luminance non-uniformity of a surface of the light guiding plate can be reduced.

A light emitting module according to another aspect of the present disclosure has a light-transmissive light guiding plate, a light emitting element unit. The light-transmissive light guiding plate has a first main surface serving as a light emitting surface from which light exits and a second main surface opposite to the first main surface. The second main surface defines a recess on it. The light emitting element unit is fixed to the recess of the light guiding plate. The light emitting element unit has a light emitting element having a light emission surface and a light adjustment portion containing a fluorescent material, and a bonding wall. The light adjustment portion is integrally bonded to the light emitting element. Also, the light adjustment portion has an insertion portion disposed in the recess. The insertion portion has an outline smaller in size than an inner surface outline of the recess. The bonding wall is formed with a light-transmissive bonding agent filled in a ring gap formed between the insertion portion and the recess.

The light emitting module has such a feature that a light emitting element unit a fluorescent material-containing light adjustment portion is bonded to a light emission surface of a light emitting element is bonded to a recess of a light guiding plate. Furthermore, the outline of an insertion portion of the light emitting element unit, which is disposed in the recess, is smaller in size than the inner shape of the recess of the light guiding plate, and a bonding wall formed using a light-transmissive bonding agent supplied in a ring gap formed between the insertion portion and the recess. This can allow the light emitting module to have light emission characteristics with little luminance non-uniformity and to have reduced thickness as a whole. This is because the insertion portion of the light emitting element unit is disposed in the recess of the light guiding plate, the light-transmissive bonding wall is provided between the insertion portion of the light emitting element unit and the recess, and the light emitting element unit is accurately disposed at a predetermined position in the recess of the light guiding plate, so that light emitted from the light emitting element can enter into the light guiding plate through the light adjustment portion, be diffused at the light guiding plate, and exit outside.

DETAILED DESCRIPTION OF EMBODIMENTS

Figure 1:
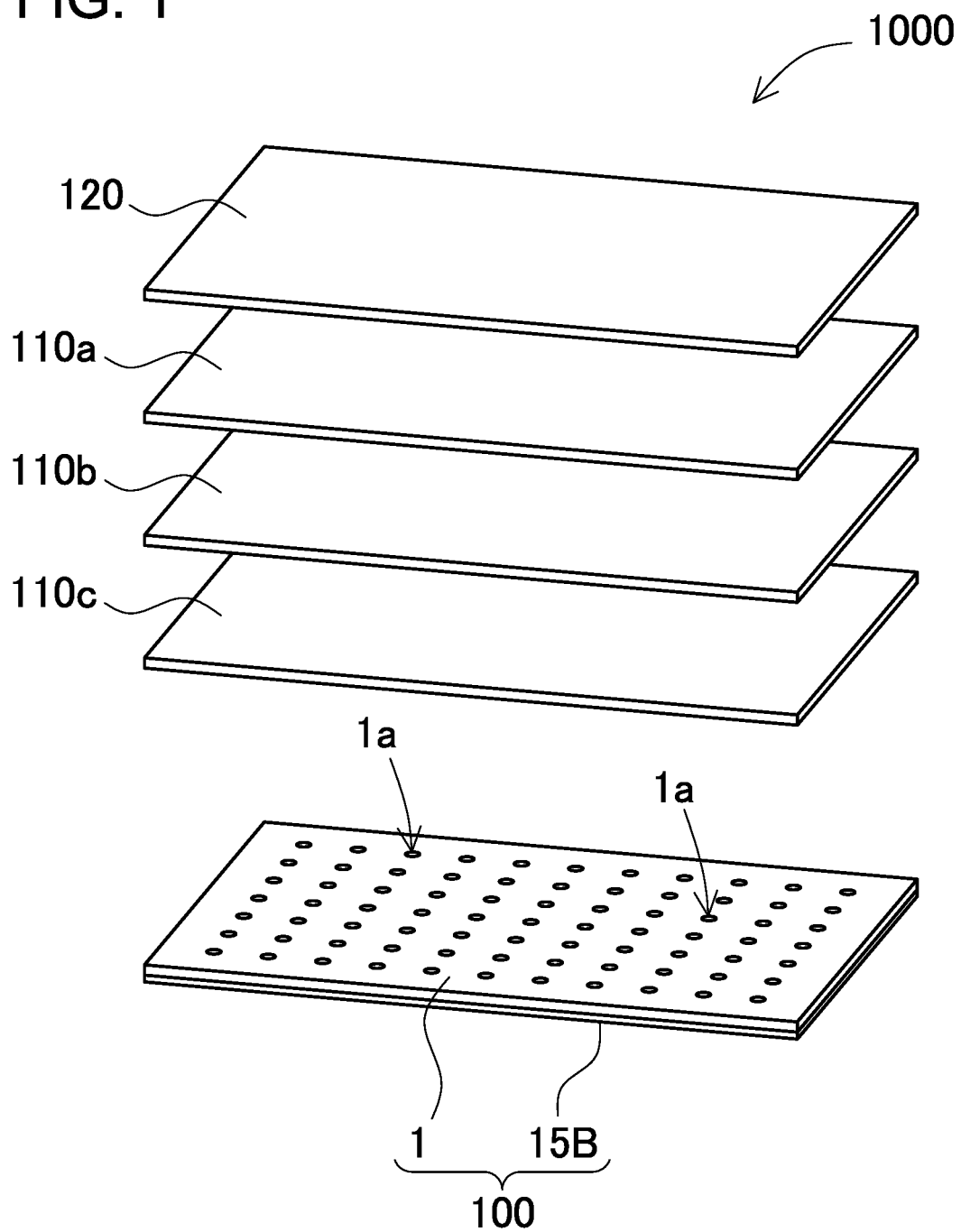
FIG. 1 is a block diagram showing a configuration of each part of a liquid crystal display device according to an embodiment of the present disclosure.

Hereinafter, the present disclosure will be described in detail with reference to the drawings. In the following descriptions, terms showing a specific direction or position (e.g. "upper", "lower" and other terms relating to such terms) are used as necessary, but these terms are used for ease of understanding of the disclosure by referring to the drawings, and the meaning of these terms does not limit the technical scope of the present disclosure. In the following description, in principle, identical name and reference character denote an identical or similar member.

Further, embodiments described below are intended to give an example of a light emitting module and a method of manufacturing the light emitting module for embodying the technical idea of the present disclosure, and do not limit the present disclosure to the following embodiments. In addition, unless otherwise specified, the dimensions, materials, shapes, relative arrangements and so on of components described below are not intended to limit the scope of the present disclosure thereto, but are intended to give an example. In addition, details described in certain embodiment or example is also applicable to other embodiments or examples. In addition, the sizes, positional relations and so on of members shown in the drawings may be exaggerated for clarification of explanation.

Liquid Crystal Display Device 1000

FIG. 1 is a block diagram showing a configuration of each part of a liquid crystal display device 1000 including a light emitting module 100 according to an embodiment. The liquid crystal display device 1000 shown in FIG. 1 includes a liquid crystal panel 120, two pieces of lens sheets 110a and 110b, a diffusion sheet 110c and a light emitting module 100. The liquid crystal display device 1000 shown in FIG. 1 is a so-called direct backlighting liquid crystal display device in which the light emitting module 100 is stacked under the liquid crystal panel 120. The liquid crystal display device 1000 irradiates the liquid crystal panel 120 with light emitted from the light emitting module 100. In addition to the above-described constituent members, members such as a polarizing film and a color filter may be provided.

Light Emitting Module 100

Figure 2:
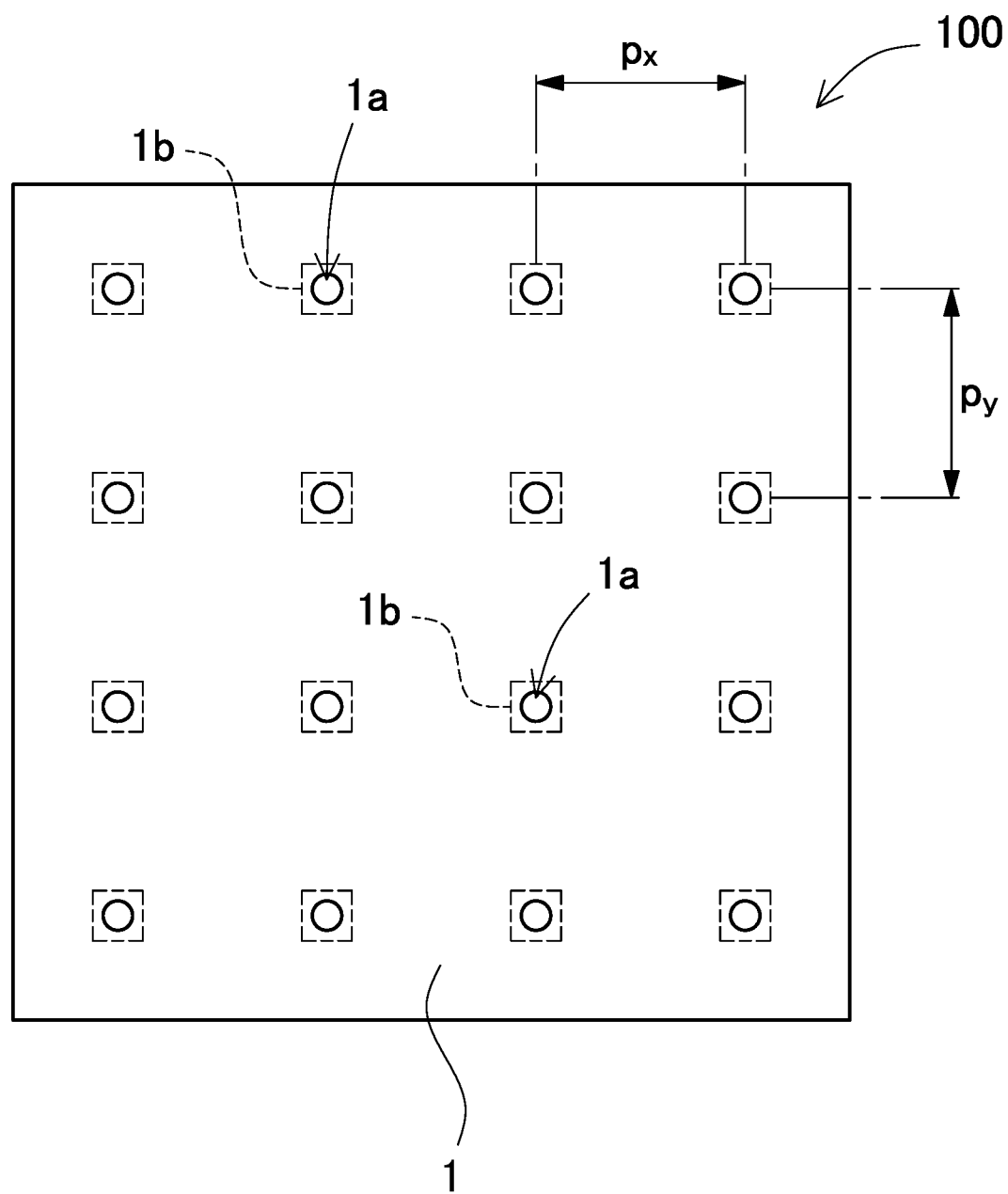
FIG. 2 is a schematic plan view of a light emitting module according to the embodiment.
Figure 3:
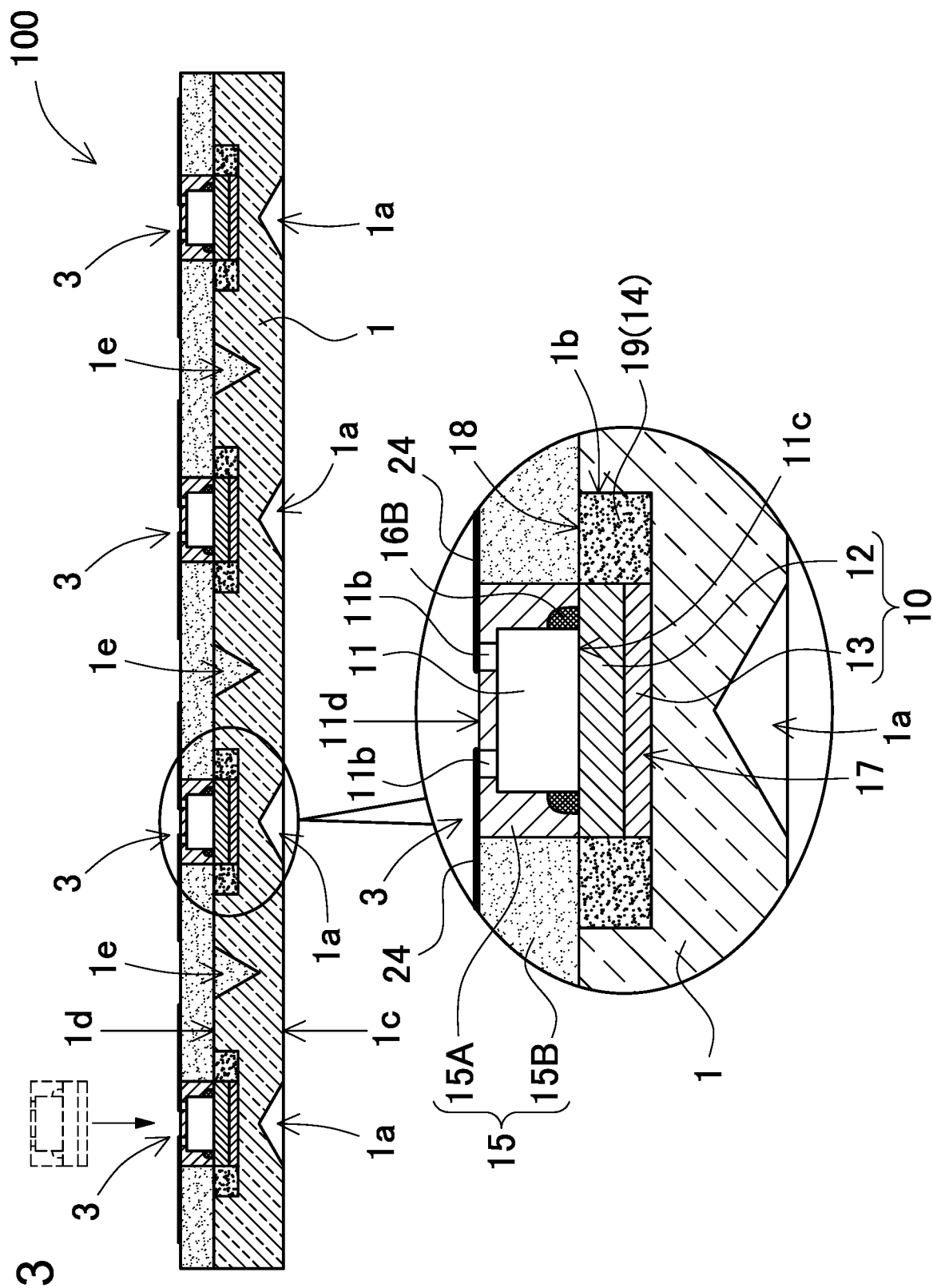
FIG. 3 is a partially enlarged schematic sectional view of the light emitting module according to the embodiment, where the light emitting module is upside down with a light guiding plate positioned on the lower side.

FIGS. 2 and 3 show a configuration of the light emitting module of this embodiment. FIG. 2 is a schematic plan view of the light emitting module according to this embodiment. FIG. 3 is a partially enlarged schematic sectional view showing the light emitting module according to this embodiment, where the light emitting module is upside down with a light guiding plate positioned on the lower side.

The light emitting module 100 shown in these drawings includes a light guiding plate 1, and a plurality of light emitting element units 3 respectively disposed in one of recesses 1b of the light guiding plate 1. In the light emitting module 100 shown in these drawings, a plurality of recesses 1b is provided on one light guiding plate 1, and the light emitting element units 3 are respectively bonded to the recesses 1b. However, the light emitting module may have a configuration of a light emitting module 100' shown in a schematic bottom view of FIG. 4, in which one recess 1b is formed on a light guiding plate 1', the light emitting element unit 3 is bonded to the recess 1b to form a light emitting bit 5, and a plurality of light emitting bits 5 is arranged. Further, in the light emitting module 100 shown in FIG. 3, the light emitting element units 3 are each provided with a first encapsulating resin 15A which has outer lateral surfaces flush with the outer lateral surfaces of a light adjustment portion 10 and in which a light emitting element 11 is embedded, and a second main surface 1d of the light guiding plate 1 to which the light emitting element unit 3 is bonded is provided with a second encapsulating resin 15B in which the light emitting element unit 3 is embedded.

In the light emitting element unit 3, the light emitting element 11 is bonded to a surface of the light adjustment portion 10 on which a wavelength conversion portion 12 is present. The light emitting element 11 has an upper surface as an electrode-formed surface 11d and a lower surface as a light emission surface 11c. The light emitting element 11 irradiates the light adjustment portion 10 by emitting light mainly from the light emission surface 11c. In the light emitting module 100 shown in FIGS. 2 and 3, the light emitting element units 3 are respectively arranged in recesses 1b provided in a matrix form on the light guiding plate 1, and bonded to the light guiding plate 1. The light guiding plate 1 has a first main surface 1c and a second main surface 1d, the first main surface 1c serving as a light emitting surface from which light exits, the second main surface 1d being provided with a plurality of recesses 1b. In the recess 1b, a part of the light emitting element unit 3, in other words, the light adjustment portion 10 is positioned in the drawing. The light adjustment portion 10 shown in FIG. 2 includes the wavelength conversion portion 12 and a light diffusion portion 13 stacked on the wavelength conversion portion 12. The light adjustment portion 10 includes the wavelength conversion portion 12 stacked on the light emitting element 11 side, and the light diffusion portion 13 stacked on the light guiding plate 1 side. In the light adjustment portion 10, light transmitted through the wavelength conversion portion 12 is diffused by the light diffusion portion 13, and applied to the light guiding plate 1, so that light exiting from the light guiding plate 1 can be made more uniform.

The light emitting module 100 according to the present disclosure can have a reduced thickness as a whole because the recess 1b is provided on the light guiding plate 1, and the light emitting element unit 3, to which the light adjustment portion 10 including the wavelength conversion portion 12 is bonded, is disposed in the recess 1b. The recess 1b is provided on the light guiding plate 1, and the light emitting element unit 3 is disposed in and bonded to the recess 1b, positional deviation of the light emitting element unit 3 and the light guiding plate 1 can be more reliably alleviated as compared to a light emitting module in which a light emitting element is mounted on a wiring substrate, and then light guiding plates are combined. In particular, in the light emitting module 100, the light emitting element unit 3 having an integral configuration of the light emitting element 11 and the light adjustment portion 10 with the wavelength conversion portion 12 bonded to the light emitting element 11 is disposed in the recess 1b of the light guiding plate 1. Thus both the wavelength conversion portion 12 and the light emitting element 11 can be disposed at a predetermined position on the light guiding plate 1 with high accuracy to attain favorable optical characteristics. In particular, the light emitting module 100 in which light from the light emitting element 11 is transmitted through the wavelength conversion portion 12, guided to the light guiding plate 1, and exits outside can realize mounting with less positional deviation of the light emitting element 11, the wavelength conversion portion 12 and the light guiding plate 1. This can improve light emission characteristics in relation to, for example, color non-uniformity and luminance non-uniformity of light exiting outside from the light guiding plate 1, to thereby achieve good light emission characteristics.

In a direct backlighting liquid crystal display device, the distance between a liquid crystal panel and a light emitting module is small, and therefore color non-uniformity and luminance non-uniformity of the light emitting module may cause color non-uniformity and luminance non-uniformity of the liquid crystal display device. Thus, a light emitting module with little color non-uniformity and luminance non-uniformity is desired as a light emitting module for a direct backlighting liquid crystal display device.

Employing the configuration of the light emitting module 100 of this embodiment can reduce luminance non-uniformity and color non-uniformity while reducing the thickness of the light emitting module 100 to 5 mm or less, 3 mm or less, 1 mm or less or the like.

Members that form the light emitting module 100 according to this embodiment, and methods of manufacturing the members will be described in detail below.

Light Guiding Plate 1

Figure 4:
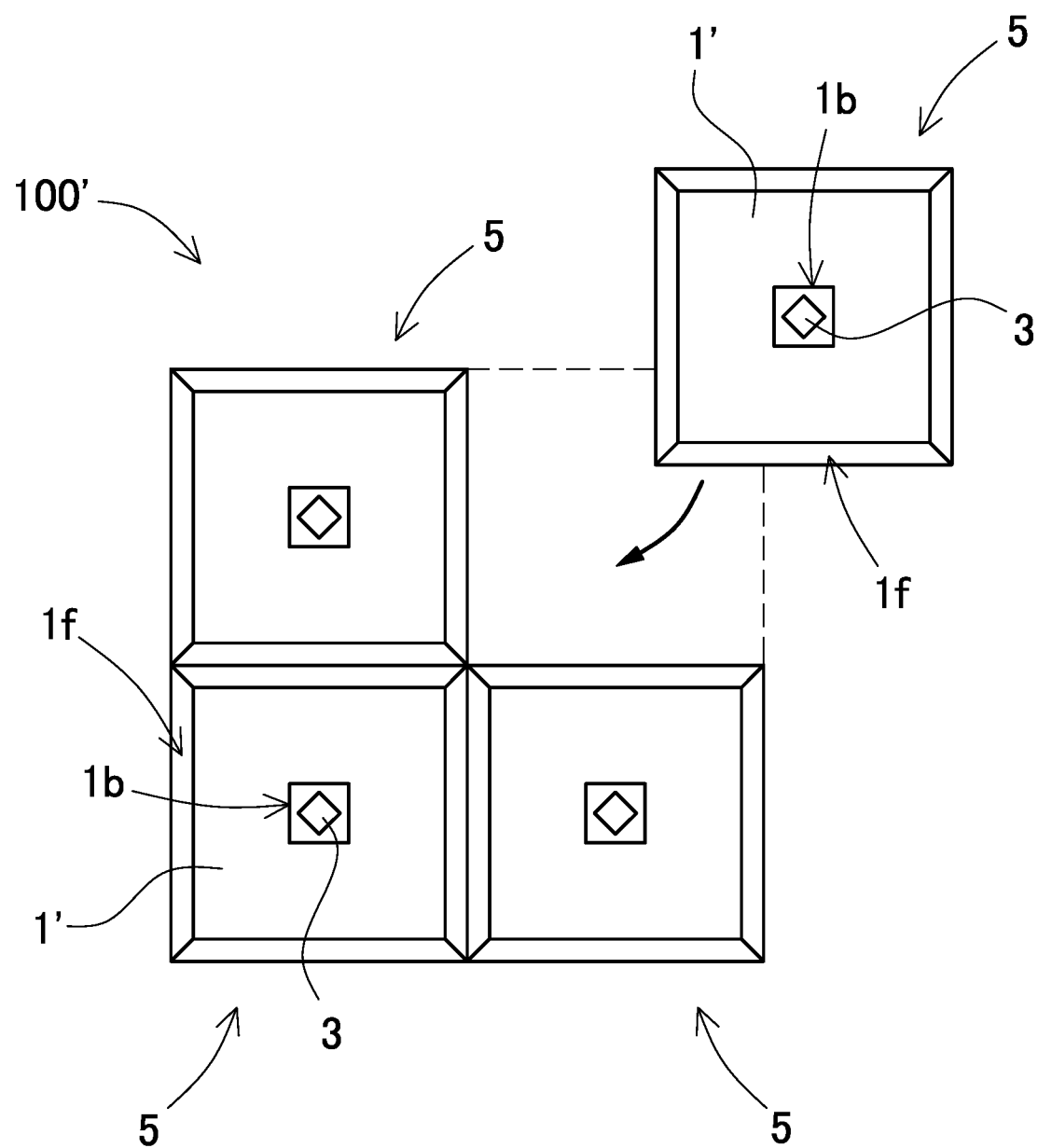
FIG. 4 is a schematic bottom view of a light emitting module according to another embodiment of the present disclosure.

The light guiding plate 1 is a light-transmissive member in which light incident from a light source is formed into a planar shape, and exits outside. As shown in FIG. 2, the light guiding plate 1 in this embodiment has a first main surface 1c as a light emitting surface, and a second main surface 1d positioned on a side opposite to the first main surface 1c. The light guiding plate 1 is provided with a plurality of recesses 1b formed on the second main surface 1d and a V-shaped groove 1e provided between adjacent recesses 1b. A part of the light emitting element unit 3 is positioned in the recess 1b. Inserting a part of the light emitting element 11 into the recess 1b of the light guiding plate 1 can reduce the thickness of the light emitting module as a whole. The light guiding plate 1 is provided with a plurality of recesses 1b, and the light emitting element units 3 are respectively disposed in the recesses 1b to form the light emitting module 100 as shown in FIGS. 2 and 3, or one light emitting element unit 3 is disposed on the light guiding plate 1' with one recess 1b to form the light emitting bit 5, and a plurality of light emitting bits 5 is arranged on a plane to form the light emitting module 100' as shown in FIG. 4. In the light guiding plate 1 provided with a plurality of recesses 1b, at least one grid-like V-shaped groove 1e is formed between recesses 1b as shown in FIG. 3. The light guiding plate 1 provided with one recess 1b has an inclined surface 1f inclined downward toward the outer peripheral edge on an outer peripheral portion of the second main surface 1d as shown in FIG. 4.

The V-shaped groove 1e and the inclined surface 1f are provided with an encapsulating resin 15 which reflects light as described later. The encapsulating resin 15 supplied in the V-shaped groove 1e is preferably formed using a white resin which reflects light, and the encapsulating resin 15 of white resin can alleviate incidence of light emitted from the light emitting element 11 to a neighboring light guiding plate 2 sectioned by the V-shaped groove 1e, so that light from each light emitting element 11 is less likely to leak to a neighbor. The encapsulating resin 15 bonded to the inclined surface 1f provided on an outer peripheral portion of the second main surface 1d of one light guiding plate 1 can alleviate leakage of light to the periphery of the light guiding plate 1, to thereby alleviate an intensity decrease of light emitted from the first main surface 1c of the light guiding plate 1.

The size of the light guiding plate 1 is appropriately determined according to the number of recesses 1b, and for example, the light guiding plate 1 with a plurality of recesses 1b may have a size in a range of about 1 cm to about 200 cm, preferably about 3 cm to about 30 cm, on each side. The light guiding plate 1 may have a thickness in a range of about 0.1 mm to about 5 mm, preferably about 0.5 mm to about 3 mm. The planar shape of the light guiding plate 1 may be a substantially rectangular shape, a substantially circular shape or the like.

As a material for the light guiding plate 1, optically transparent materials such as resin materials including a thermoplastic resins and thermosetting resins, or glass. Example thermoplastic resins include acrylic, polycarbonate, a cyclic polyolefin, polyethylene terephthalate or polyester. Example thermosetting resins include epoxy or silicone. In particular, thermoplastic resin materials are preferable because they can be efficiently processed by injection molding. In particular, polycarbonate is preferable because it has high transparency and is inexpensive. For a light emitting module which is manufactured without being exposed to a high-temperature environment as in reflow soldering in a manufacturing process, even a thermoplastic material having low heat resistance, such as polycarbonate, can be used.

The light guiding plate 1 can be molded by, for example, injection molding or a transfer mold. The light guiding plate 1 can be formed into a shape having recesses 1b by a mold, and mass-produced at low cost while positional deviation of recesses 1b is reduced. However, the light guiding plate can also be provided with recesses by cutting processing, for example, with a NC processing machine after being molded into a plate shape.

The light guiding plate 1 in this embodiment may be formed with a single layer, or multilayer formed by stacking a plurality of light-transmissive layers. When employing a multilayered light guiding plate, one or more layers having different refractive indices, for example, a layer of air, is provided between appropriately selected layers. Accordingly, light is more easily diffused, so that a light emitting module with reduced luminance non-uniformity can be obtained. Such a configuration can be obtained by, for example, providing a spacer between appropriately-selected light-transmissive layers to separate the layers, and providing a layer of air. In addition, on the first main surface 1c of the light guiding plate 1, a light-transmissive layer, and a layer having a different refractive index, e.g. a layer of air, between the first main surface 1c of the light guiding plate 1 and the light-transmissive layer may be provided. Accordingly, light is more easily diffused, so that a liquid crystal display device having reduced luminance non-uniformity can be obtained. Such a configuration can be obtained by, for example, providing a spacer in at least one appropriately-selected layer between the light guiding plate 1 and light-transmissive layer to separate the light guiding plate 1 and the light-transmissive layer, to thereby provide a layer of air.

Optically Functional Portion 1a

The light guiding plate 1 may include an optically functional portion 1a on the first main surface 1c side. The optically functional portion 1a can have a function of, for example, spreading light in the surface of the light guiding plate 1. For example, a material different in refractive index from the material of the light guiding plate 1 is provided. Specifically, it is possible to use a recess which is formed on the first main surface 1c side, and has an inverted cone shape, or an inverted polygonal pyramid shape such as an inverted quadrangular pyramid shape or an inverted hexagonal pyramid shape, or an inverted truncated cone shape, an inverted truncated polygonal pyramid shape or the like and which reflects applied light in a lateral direction of the light emitting element unit 3 at an interface between the inclined surface of the recess and the material different in refractive index from the light guiding plate 1 (e.g. air). In addition, for example, the recess 1b having an inclined surface and provided with a light-reflective material (e.g. a reflecting film of metal or the like, or a white resin) or the like may also be used. The inclined surface of the optically functional portion 1a may be a straight line or a curved line in sectional view. As described later, the optically functional portion 1a is preferably provided at a position corresponding to each light emitting element unit 3, in other words, a position on a side opposite to the light emitting element unit 3 disposed on the second main surface 1d side. In particular, the optical axis of the light emitting element unit 3 is preferably substantially coincident with the optical axis of the optically functional portion 1a. The size of the optically functional portion 1a can be appropriately determined.

Recess 1b

The light guiding plate 1 is provided with the recess 1b formed on the second main surface 1d side. A part of the light emitting element unit 3 is disposed at a predetermine position inside the recess 1b. The recess 1b shown in FIG. 3 has a shape obtained by cutting off a part of the second main surface 1d. The recess can also be provided inside a projection formed in a ring shape on the second main surface (not shown). The inner surface outline of the recess 1b has a size larger than that of the outline of an 17 for disposing the light emitting element unit 3 in the recess 1b, and a ring gap 18 is formed between the inner periphery of the recess 1b and the outer periphery of the insertion portion 17 of the light emitting element unit 3 in a state where the insertion portion 17 of the light emitting element unit 3 is disposed. The ring gap 18 is filled with a bonding agent 14 to form a bonding wall 19. The inner surface outline of the recess 1b is formed such that the volumetric capacity of the ring gap 18 is larger than the volume of the insertion portion 17 of the light emitting element unit 3. In the light emitting module of this embodiment, the light adjustment portion 10 is disposed in the recess 1b of the light guiding plate 1, and therefore the light adjustment portion 10 is used as the insertion portion 17 of the light emitting element unit 3. The insertion portion 17 of the light emitting element unit 3 may include not only the light adjustment portion 10, but also applied as the light adjustment portion 10 and a part of the light emitting element 11 in the recess 1b.

The volumetric capacity of the ring gap 18 is, for example, not less than 1.2 times, preferably not less than 1.5 times, and more preferably not less than 2 times the volume of the insertion portion 17 of the light emitting element unit 3. The ring gap 18 may be filled with the bonding agent 14 to form the bonding wall 19. In the light guiding plate 1 shown in FIG. 4, the inner surface outline of the recess 1b may have a quadrangular shape, and the outline of the insertion portion 17 of the light emitting element unit 3 disposed in the recess 1b may have a quadrangular shape. The quadrangular insertion portion 17 is disposed in the recess 1b with an orientation in which each side crosses the quadrangular recess 1b, in other words, an orientation in which the insertion portion is rotated with respect to the quadrangular recess 1b, so that the ring gap 18 is provided between the recess 1b and the insertion portion 17. The insertion portion 17 in this drawing is positioned in the recess 1b with an orientation in which each side is inclined at 45 degrees. The recess 1b in which the insertion portion 17 is disposed with this orientation has an inner surface outline having a size at least 2 times the size of the outline of the insertion portion 17.

Figure 5:
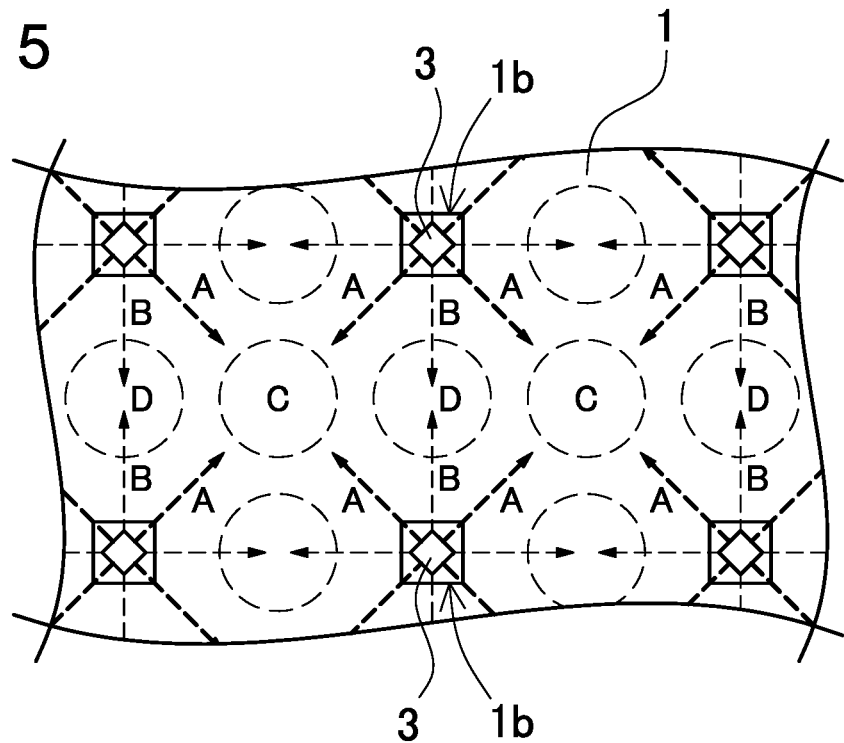
FIG. 5 is a schematic bottom view showing a quadrangular insertion portion formed obliquely with respect to a quadrangular recess.
Figure 6:
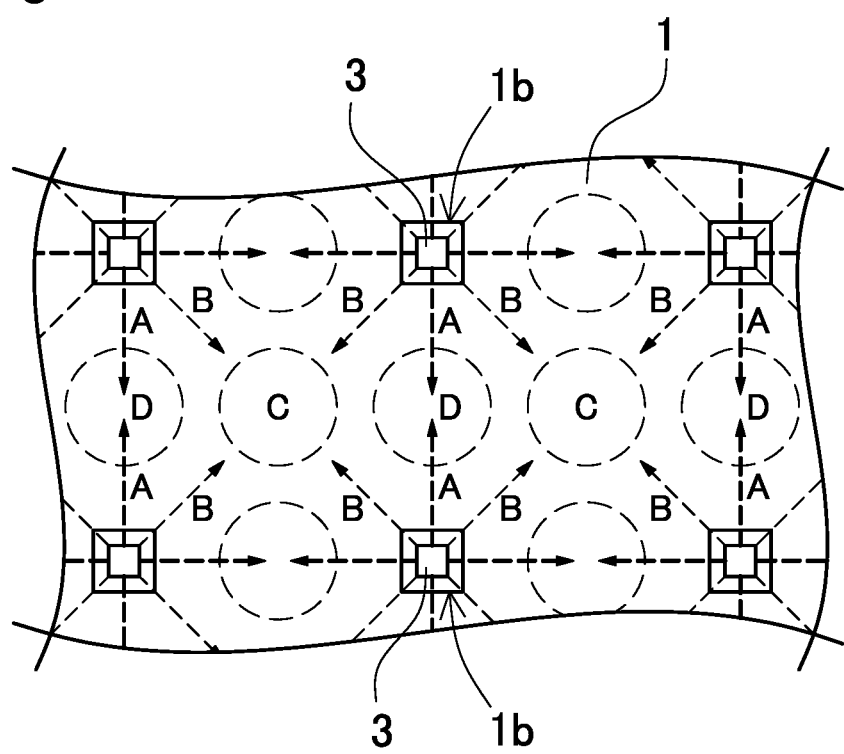
FIG. 6 is a schematic bottom view showing a quadrangular insertion portion formed parallel with respect to a quadrangular recess.

The light guiding plate 1 with the insertion portion 17 disposed in the recess 1b with an orientation shown in FIG. 5 has such a feature that luminance non-uniformity on the first main surface 1c can be reduced. This is because light emitted from each lateral surface of the insertion portion 17 to the periphery is intensely radiated in the direction of arrow A shown by a chain line in FIG. 5, so that region C in FIG. 5 is brightly irradiated. In the quadrangular insertion portion 17, the intensity of light in an arrow A direction orthogonally crossing each side is higher than the intensity of light radiated in an arrow B direction from a corner. In FIG. 5, region C is positioned at a greater distance from the insertion portion 17 than region D, and therefore tends to be dark. However, light is more intense in an arrow A direction than in an arrow B direction, thus luminance decrease can be alleviated, resulting in reduction of luminance non-uniformity. When the quadrangular insertion portion 17 is disposed in the quadrangular recess 1b with an orientation in which the sides of the insertion portion 17 are parallel to the sides of the recess 1b as shown in FIG. 6, region C is positioned at a greater distance from the insertion portion 17 than region D, and the intensity of light radiated from the insertion portion 17 decreases, so that the luminance is lower in region C than the luminance in region D.

Figure 7:
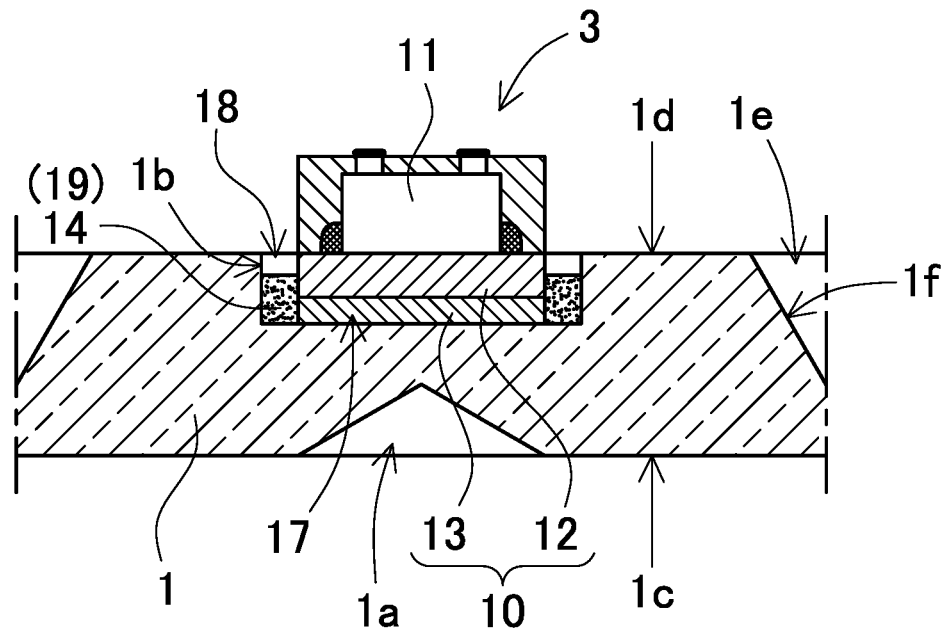
FIG. 7 is a sectional view showing the surface of a bonding wall lowered due to slight difference in filling amount of a bonding agent.
Figure 8:
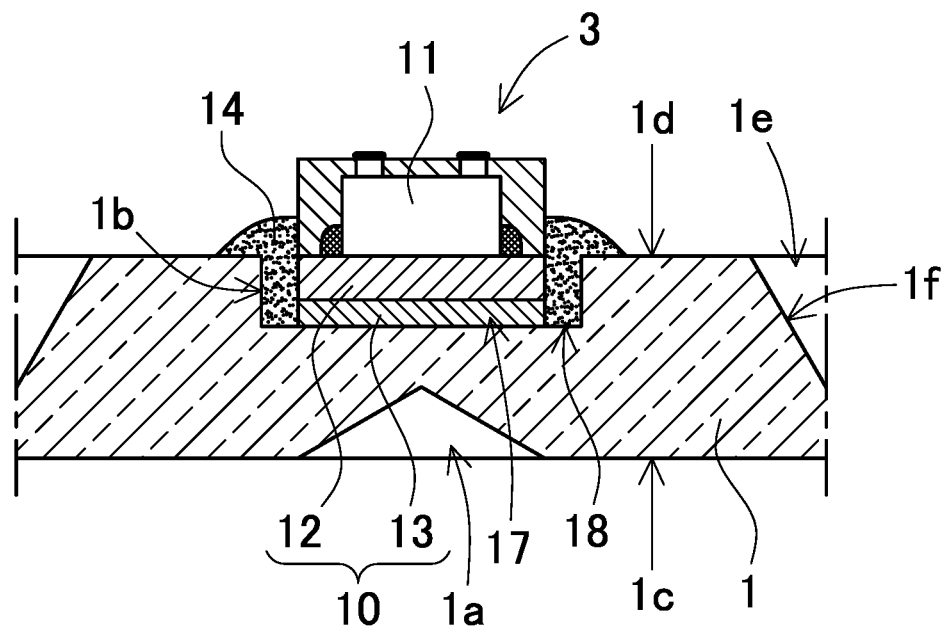
FIG. 8 is a sectional view showing the surface of a bonding wall raised due to slight difference in filling amount of a bonding agent.

The recess 1b having an inner surface outline larger in size than the outline of the insertion portion 17 has such a feature that luminance non-uniformity can be alleviated by increasing flexibility in angle of orientation in which the insertion portion 17 is disposed. This can eliminate surface level difference caused by unevenly supplying the bonding agent 14 in the ring gap 18, so that a preferable light distribution can be achieved at the outer peripheral of the recess 1b. The ring gap 18 is filled with the bonding agent 14 to form the light-transmissive bonding wall 19, and supplying uneven amount of the bonding agent 14 makes the surface level uneven, resulting in undesirable light emission. FIGS. 7 and 8 shows a state in which supplying uneven amount of the bonding agent 14 makes the liquid surface level of the bonding wall 19 uneven. FIG. 7 shows a state in which the supplying amount of the bonding agent 14 is excessively small. The surface level of the bonding wall 19 is lower than the second main surface 1d of the light guiding plate 1, and decreases to the inside of the ring gap 18, so that an air gap is generated between the light guiding plate 1 and the insertion portion 17. FIG. 8 shows a state in which the supplying amount of the bonding agent 14 is excessively large. In this case, the bonding agent 14 for forming the bonding wall is leaked out from the ring gap 18, and overruns on the second main surface 1d. The bonding agent 14 put in a gap between the light guiding plate 1 and the insertion portion 17 and rising on the second main surface 1d changes a path of light incident to the light guiding plate 1 from the insertion portion 17, resulting in undesirable light emission.

The volumetric capacity of the ring gap 18 can be made larger than the volume of the insertion portion 17 by having the inner surface outline of the recess 1b larger in size than the insertion portion 17. This structure can reduce unevenness of the liquid surface level due to variations of supplying amount of the bonding agent 14 in the ring gap 18, so that preferable light emission can be obtained in regions of the light guiding plate 1 and the insertion portion 17.

In consideration of the outline of the insertion portion 17 and the characteristics described above, the size of the recess 1b in a plan view may be, for example, in a range of 0.05 mm to 10 mm, preferably 0.1 mm to 2 mm, in terms of a diameter in a circular shape, a long diameter in an elliptical shape, and a length of a diagonal in a quadrangular shape. The depth of the recess 1b may be in a range of 0.05 mm to 4 mm, preferably 0.1 mm to 1 mm. The distance between the optically functional portion 1a and the recess 1b can be appropriately determined as long as the optically functional portion 1a and the recess 1b are separated from each other. The shape of the recess 1b in a plan view may be, for example, a substantially rectangular shape or a substantially circular shape, and can be selected according to arrangement pitches of recesses 1b or the like. The arrangement pitches of the recesses 1b (i.e., distances between the centers of two recesses 1b closest to each other) may be substantially equal. Preferably, the shape of the recess 1b in a plan view is a substantially circular shape or a substantially square shape. In particular, the recess 1b having a substantially circular shape in a plan view can desirably spread light from the light emitting element unit 3.

Light Emitting Element Unit 3

The light emitting element unit 3 is a light source for the light emitting module 100. In the light emitting element unit 3, the light adjustment portion 10 with the wavelength conversion portion 12 is bonded to the light emitting element 11 as shown in FIG. 3. Further, in the light emitting element unit 3 in this embodiment, the outer lateral surfaces of the first encapsulating resin 15A for embedding the light emitting element 11 are flush with the outer lateral surfaces of the light adjustment portion 10. The light emitting element unit 3 is disposed in the recess 1b of the light guiding plate 1 to emit light outside through the light guiding plate 1. The light emitting element unit 3 in the drawing is disposed inside the recess 1b by disposing the light adjustment portion 10 as the insertion portion 17 in the recess 1b of the light guiding plate 1. The light emitting element unit 3 has the light adjustment portion 10 bonded to the bottom of the recess 1b formed on the light guiding plate 1.

The light emitting element unit 3 shown in FIG. 3 has the light adjustment portion 10 bonded to the light emission surface 11c of the light emitting element 11. In the light emitting element 11, the light adjustment portion 10 is bonded to the light emission surface 11c such that a surface opposite to the electrode-formed surface 11d serves as the light emission surface 11c. In the light emitting module of this embodiment, a facedown type is employed in which the light emission surface 11c is positioned on a side opposite to the electrode-formed surface 11d, and the light emission surface 11c serves as a main light emitting surface, but a light emitting element of faceup type can also be used. In the light emitting element 11 shown in FIG. 3, a surface opposite to the light emission surface 11c serves as the electrode-formed surface 11d, and the electrode-formed surface 11d is provided with a pair of electrodes 11b. A pair of electrodes 11b is wired and is electrically connected in a structure as described later. The light emitting element unit 3 and the light guiding plate 1 are bonded to each other with the light-transmissive bonding agent 14 formed of a material using a light-transmissive resin.

For example, the light emitting element 11 includes a light-transmissive substrate of sapphire or the like, and a semiconductor layered structure stacked on the light-transmissive substrate. The semiconductor layered structure includes a light emitting layer, and an n-type semiconductor layer and a p-type semiconductor layer. The light emitting layer is interposed between the n-type semiconductor layer and the p-type semiconductor layer. The n-type semiconductor layer and the p-type semiconductor layer are electrically connected to at least one n-side electrode and at least one p-side electrode 11b, respectively. In the light emitting element 11, for example, the light emission surface 11c of a light-transmissive substrate is disposed so as to face the light guiding plate 1, and a pair of electrodes 11b is formed on the electrode-formed surface 11d on a side opposite to the light emission surface 11c.

The vertical, lateral and height dimensions of the light emitting element 11 have no requirement in their sizes, but it is preferable to use the semiconductor light emitting element 11 having each of vertical and lateral dimensions of 1000 μm or less in a plan view, it is more preferable to use the light emitting element 11 having each of vertical and lateral dimensions of 500 μm or less in a plan view, and it is still more preferable to use the light emitting element 11 having each of vertical and lateral dimensions of 200 μm or less in a plan view. Such a light emitting element 11 can realize a high-definition image at the time of local dimming of the liquid crystal display device 1000. When the light emitting element 11 has vertical and lateral dimensions of 500 µm or less, the light emitting element 11 can be provided at low cost, and therefore the cost of the light emitting module 100 can be reduced. When the light emitting element 11 has vertical and lateral dimensions of 250 µm or less, the upper surface of the light emitting element 11 has a small surface area, and therefore the amount of light emitted from the lateral surface of the light emitting element 11 is relatively large. That is, such a light emitting element 11 tends to emit light in a batwing shape, and is therefore preferably used for the light emitting module 100 of this embodiment in which the light emitting element 11 is bonded to the light guiding plate 1, and a distance between the light emitting element 11 and the light guiding plate 1 is short.

The light guiding plate 1 can be provided with the optically functional portion 1a having reflection and diffusion functions, such as a lens. The light guiding plate 1 can laterally spread light from the light emitting element 11 to uniform the light emission intensity in the surface of the light guiding plate 1. However, in the light guiding plate 1 with a plurality of optically functional portions 1a formed at the corresponding positions of a plurality of light emitting elements 11, it may be difficult to maintain corresponding positions of all the light emitting elements 11 and optically functional portions 1a accurately. Particularly, in the case of a structure in which a large number of small light emitting elements 11 are provided, it is difficult to maintain corresponding positions of all the light emitting elements 11 and optically functional portions 1a accurately. Deviation of corresponding positions of the light emitting element 11 and the optionally functional portion 1a weakens the function of the optically functional portion 1a to sufficiently spread light. Thus brightness on the surface is partially reduced, thereby leading to non-uniformity in luminance. Particularly, in a method including combining light guiding plates 1 after mounting the light emitting element 11 on a wiring substrate, it is necessary to give consideration to each of positional deviation of the wiring substrate and the light emitting elements 11 and positional deviation of the light guiding plate 1 from the optically functional portions 1a in a planar direction and a stacking direction. Thus there is a possibility that optical axis of the light emitting element 11 and optical axis of the optically functional portion 1a are less likely to be coincide with each other.

The light emitting module 100 in this embodiment has a structure in which the recesses 1b and the optically functional portions 1a are provided on the light guiding plate 1, and the light emitting element units 3 are respectively disposed in the recesses 1b, so that both the light emitting elements 11 and the optically functional portions 1a can respectively be disposed with high accuracy. Accordingly, light from the light emitting element 11 can be made uniform accurately by the optically functional portion 1a to obtain a high-quality light source for backlight with little luminance non-uniformity and color non-uniformity.

In the light guiding plate 1 with the optically functional portion 1a provided on a surface on a side opposite to the recess 1b in which the light emitting element 11 is disposed, the optically functional portion 1a is provided at the position of the recess 1b in which the light emitting element 11 is disposed in perspective plan view, so that positioning of the light emitting element 11 and the optically functional portion 1a can be further facilitated to dispose both the light emitting element 11 and the optically functional portion 1a with substantially no relative position displacement.

As the light emitting element 11, the rectangular light emitting element 11 having a square shape or oblong shape in a plan view is used. For the light emitting element 11 to be used for a high-definition liquid crystal display device, it is preferable that an oblong light emitting element is used, and the shape of the upper surface of the light emitting element has a long side and a short side. In the case of a high-definition liquid crystal display device, the number of light emitting elements to be used is several thousands or more, and a light emitting element mounting step is an important step. Even if a rotational shift (e.g. a shift in a direction of ±90 degrees) occurs in some of a plurality of light emitting elements in the light emitting element mounting step, the shift is easily visually observed when light emitting elements having an oblong shape in a plan view are used. In addition, a p-type electrode and an n-type electrode can be formed at a distance from each other, and therefore wiring 21 as described later can be easily formed. On the other hand, when light emitting elements 11 having a square shape in a plan view are used, small light emitting elements 11 can be manufactured with high mass productivity. The density (i.e., arrangement pitch) of light emitting elements 11, in other words, the distance between light emitting elements 11 may be, for example, in a range of about 0.05 mm to 20 mm, preferably about 1 mm to 10 mm.

In the light emitting module 100 with a plurality of light emitting element units 3 disposed on the light guiding plate 1 having a plurality of recesses 1b, light emitting element units 3 are two-dimensionally arranged in a plan view of the light guiding plate 1. Preferably, a plurality of light emitting element units 3 is provided in recesses 1b which are tow-dimensionally arranged along two orthogonal directions, in other words, the x-direction and the y-direction as shown in FIG. 2. The x-direction arrangement pitch $p_x$ and the y-direction arrangement pitch $p_y$ of recesses 1b in which a plurality of light emitting element units 3 is disposed may be equal between the x-direction and the y-direction as shown in the example in FIG. 2, or may be different between the x-direction and the y-direction. In addition, the two directions of arrangement are not necessarily perpendicular to each other. In addition, x-direction or y-direction arrangement pitches are not necessarily equal, and may be unequal. For example, recesses 1b in which light emitting element units 3 are disposed may be arranged such that the distance increases as approaching toward the outer edge from the center of the light guiding plate 1. The pitch between light emitting element units 3 disposed in recesses 1b is a distance between the optical axes, in other words, the centers, of light emitting element units 3.

For the light emitting element 11, a known semiconductor light emitting element can be used. In this embodiment, the light emitting element 11 is exemplary explained as a facedown type light emitting diode. The light emitting element 11 emits, for example, blue light. For the light emitting element 11, an element which emits light other than blue light can also be used, and, a faceup type light emitting element can also be used. A plurality of light emitting elements respectively emit light of different colors may be used as the light emitting element 11. Light emitted from the light emitting element 11 is adjusted its color at the wavelength conversion portion 12 before exiting outside.

As the light emitting element 11, an element which emits light having a certain wavelength can be selected. For example, as an element which emits blue or green light, a light emitting element using a nitride-based semiconductor ($In_xAl_yGa_{1-x-y}N$, $0 \leq X$, $0 \leq Y$, $X+Y \leq 1$) or GaP can be used. As an element which emits red light, a light emitting element including a semiconductor such as GaAlAs or AlInGaP can be used. Further, semiconductor light emitting elements composed of materials other than those described above can also be used. A light emission wavelength can be variously selected according to the material of a semiconductor layer and the degree of mixed crystal thereof. The composition, color of light emission, size and number of light emitting elements to be used may be appropriately selected according to a purpose.

Light Adjustment Portion 10

In this embodiment, the light emitting element unit 3 is provided with the light adjustment portion 10 in which the color of light emitted from the light emitting element 11 is adjusted before the light is incident to the light guiding plate 1. The light adjustment portion 10 includes the wavelength conversion portion 12 for adjusting the color of light emitted by the light emitting element 11. The light adjustment portion 10 is bonded to the light emission surface 11c of the light emitting element 11 to adjust the color of light emitted by the light emitting element 11. The light adjustment portion 10 preferably includes the wavelength conversion portion 12 and the light diffusion portion 13. In the light adjustment portion 10, the wavelength conversion portion 12 is bonded to the light diffusion portion 13, and the wavelength conversion portion 12 is disposed on the light emitting element 11 side. In the light adjustment portion 10 can also be configured by stacking a plurality of wavelength conversion portions 12 and light diffusion portions 13. In the light emitting module 100 of this embodiment, the light adjustment portion 10 is disposed in the recess 1b of the light guiding plate 1, and used as the insertion portion 17 for the light emitting element unit 3. The light adjustment portion 10 transmits light entered from the light emitting element 11 before the light enters the light guiding plate 1. For the purpose of, for example, thinning the light emitting module 100 the light adjustment portion 10 is positioned inside the recess 1b of the light guiding plate 1, and disposed in the recess 1b without protruding from a plane flush with the second main surface 1d as shown in FIG. 3. The light adjustment portion 10 shown in FIG. 3 has a thickness equal to the depth of the recess 1b, and the surface of the light adjustment portion 10 is flush with the second main surface 1d. Alternatively, the light adjustment portion may be positioned inside the recess, and have such a thickness that the light adjustment portion slightly protrude from a plane flush with the second main surface of the light guiding plate (not shown).

In the light emitting element unit 3 shown in FIG. 3, the outline of the light adjustment portion 10 is larger in size than the outline of the light emitting element 11. In the light emitting element unit 3, all light emitted from the light emission surface 11c of the light emitting element 11 is transmitted through the light adjustment portion 10 before the light enters the light guiding plate 1, so that color non-uniformity can be reduced.

The wavelength conversion portion 12 contains a wavelength conversion material added to a base material. The light diffusion portion 13 contains a diffusion material added to a base material. Examples of material for the base material can be a light transmissive material such as an epoxy resin, a silicone resin, a mixed resin thereof, or glass. From the viewpoint of light resistance of the light adjustment portion 10 and ease of forming, a silicone resin selected as the base material is beneficial. The base material for the light adjustment portion 10 is preferably a material having a refractive index higher than the material for the light guiding plate 1.

Examples of the wavelength conversion material contained in the wavelength conversion portion 12 include YAG fluorescent materials, β-sialon fluorescent materials, and fluoride-based fluorescent materials such as KSF-based fluorescent materials. In particular, when various types of wavelength conversion members are used for one wavelength conversion portion 12, more preferably, the wavelength conversion portion 12 contains a β-sialon fluorescent material which emits greenish light and a fluoride-based fluorescent material such as a KSF-based fluorescent material which emits red light, the color reproduction range of the light emitting module can be expanded. In this case, it is preferable that the light emitting element 11 includes a nitride semiconductor ($In_xAl_yGa_{1-x-y}N$, $0 \leq X$, $0 \leq Y$, $X+Y \leq 1$) capable of emitting short-wavelength light that can efficiently excite the wavelength conversion member. For example, the wavelength conversion portion 12 may contain a KSF-based fluorescent material (i.e., red fluorescent material) in an amount of 60% by weight or more, preferably 90% by weight or more so that red light can be obtained in use of the light emitting element 11 which emits blue light. That is, the wavelength conversion portion 12 may contain a wavelength conversion member which emits light of specific color, so that the light emitting element units emit light of specific color. The wavelength conversion material may be a quantum dot. In the wavelength conversion member 12, the wavelength conversion material may be disposed in any manner. For example, the wavelength conversion material may be substantially evenly distributed, or unevenly distributed. Alternatively, a multilayer each containing at least one wavelength conversion member may be provided.

For the light diffusion portion 13, for example, a material including the above-described resin material to which white inorganic particles of $SiO_2$, $TiO_2$ or the like are added can be used.

Encapsulating Resin 15

The light emitting module 100 shown in FIG. 3 is provided by bonding the encapsulating resin 15 to the second main surface 1d of the light guiding plate 1. Preferably, the encapsulating resin 15 is formed using a white resin in which white powder and the like as an additive reflecting light is added to a transparent resin. The encapsulating resin 15 of white resin reflects light emitted from the outer peripheral portion or the electrode surface of the light emitting element 11, light emitted from the back surface of the light adjustment portion 10, light emitted from the back surface of the bonding wall 19, and light emitted from the second main surface 1d of the light guiding plate 1, so that light emitted from the light emitting element 11 can effectively exit outside from the first main surface 1c of the light guiding plate 1. In the light emitting module 100 shown in FIG. 3, the encapsulating resin 15 is sectioned into a first encapsulating resin 15A and a second encapsulating resin 15B. In the light emitting module 100 in the drawing, the encapsulating resin 15 is sectioned into the first encapsulating resin 15A integrally formed with the light emitting element unit 3, and the second encapsulating resin 15B bonded to the second main surface 1d of the light guiding plate 1. However, the encapsulating resin may have an integral structure without being sectioned into the first encapsulating resin 15A and the second encapsulating resin 15B. In this case, the light emitting module is manufactured in the following manner: a light emitting element unit provided with no first encapsulating resin is bonded to a light guiding plate, and thereafter an encapsulating resin is bonded to a second main surface of the light guiding plate.

The light emitting module 100 in which the first encapsulating resin 15A and the second encapsulating resin 15B are sectioned is manufactured such that the first encapsulating resin 15A is bonded to the light emitting element 11 and the light adjustment portion 10 to form the first encapsulating resin 15A into a block having an integral structure with the light emitting element 11 and the light adjustment portion 10 in a process of manufacturing the light emitting module 100. The second encapsulating resin 15B is bonded to the second main surface 1d of the light guiding plate 1 such that the light emitting element unit 3 provided with the first encapsulating resin 15A is bonded to the light guiding plate 1, and then the second encapsulating resin 15B fills gaps between first encapsulating resins 15A.

The first encapsulating resin 15A and the second encapsulating resin 15B are in contact with each other. Further, the first encapsulating resin 15A is in contact with the light emitting element 11. The first encapsulating resin 15A is present on the periphery of the light emitting element 11, and embeds the light emitting element 11. The electrodes 11b of the light emitting element 11 are exposed from the surface of the first encapsulating resin 15A. The outer lateral surfaces of the first encapsulating resin 15A are flush with the outer lateral surfaces of the light adjustment portion 10, and the first encapsulating resin 15A is also in contact with the light adjustment portion 10. The first encapsulating resin 15A is a part of the light emitting element unit 3 bonded to the light emitting element 11 and the light adjustment portion 10 as an integral structure, and the first encapsulating resin 15A is bonded to the light guiding plate 1. The first encapsulating resin 15A is preferably formed using a white resin, and the first encapsulating resin 15A is capable of improving the light emission efficiency of the light emitting module 100 by reflecting light emitted in a direction toward the outer lateral surfaces of the light emitting element 11. The second encapsulating resin 15B is in contact with the first encapsulating resin 15A at a boundary between the second main surface 1d of the light guiding plate 1 and the back surface (i.e., a surface close to the light emitting element 11) of the bonding wall 19. The second encapsulating resin 15B is provided on a surface that is flush with a surface of the first encapsulating resin 15A on which the electrodes 11b are exposed. The second encapsulating resin 15B is bonded to the second main surface 1d of the light guiding plate 1, to which the light emitting element unit 3 having the first encapsulating resin 15A as an integral structure is bonded, so that the second encapsulating resin 15B is provided between first encapsulating resins 15A.

The second encapsulating resin 15B is stacked on the light guiding plate 1 to reinforce the light guiding plate 1. In addition, the second encapsulating resin 15B is preferably formed using a white resin, and reflect light to efficiently introduce light emitted from the light emitting element 11 into the light guiding plate 1, to thereby increase the light output of the first main surface 1c of the light guiding plate 1. Furthermore, the second encapsulating resin 15B formed using a white resin can serve as both a protection member for the light emitting element 11 and a reflection layer on the second main surface 1d of the light guiding plate 1, resulting in reduction in the thickness of the light emitting module 100.

For the encapsulating resin 15, a white resin having a reflectivity of 60% or more, preferably 90% or more, with respect to light emitted from the light emitting element 11 is suitable. The encapsulating resin 15 is preferably formed using a resin containing a white pigment such as white powder. In particular, a silicone resin containing inorganic white powder of titanium oxide or the like is preferable. Accordingly, an inexpensive material such as titanium oxide is used in a large amount for a member used in a relatively large amount to cover a surface of the light guiding plate 1, so that the cost of the light emitting module 100 can be reduced.

Light-Transmissive Bonding Member

In the light emitting module 100 shown in FIG. 3, a light-transmissive bonding member is used to bond the wavelength conversion portion 12 and the light diffusion portion 13, the light adjustment portion 10 and the light emitting element unit 3, and the light emitting element unit 3 and the light guiding plate 1. The light-transmissive bonding member bonds the wavelength conversion portion 12 to the light diffusion portion 13 to form the light adjustment portion 10, and bonds the light adjustment portion 10 to the light emitting element 11 to form the light emitting element unit 3. A light-transmissive bonding member 16A is the bonding agent 14 for bonding the light emitting element unit 3 to the bottom of the recess 1b of the light guiding plate 1. This light-transmissive bonding member 16A bonds the light emitting element unit 3 to the light guiding plate 1. The light-transmissive bonding member 16A is also the bonding agent 14 filling the ring gap 18 between the inner surfaces of the recess 1b and the insertion portion 17 for the light emitting element unit 3. This light-transmissive bonding member 16A forms the bonding wall 19 to bond the light adjustment portion 10 to the inner surface of the recess 1b.

The light-transmissive bonding member has a light transmittance of 60% or more, preferably 90% or more. The light-transmissive bonding member 16A propagates light emitted from the light emitting element 11. The light-transmissive bonding member 16A may contain one or more additives, such as a light diffusion material or white powder that reflects light. Alternatively, the light-transmissive bonding member 16A may be formed using only a light-transmissive resin material which does not contain a light diffusion member, white powder or the like.

As a material for the light-transmissive bonding member, a light-transmissive thermosetting resin material such as an epoxy resin or a silicone resin, or the like can be used.

Process of Manufacturing Light Emitting Module 100

FIGS. 9A to 9D and 10A to 10D show a process of manufacturing the light emitting element unit 3 according to this embodiment.

Figure 9A:
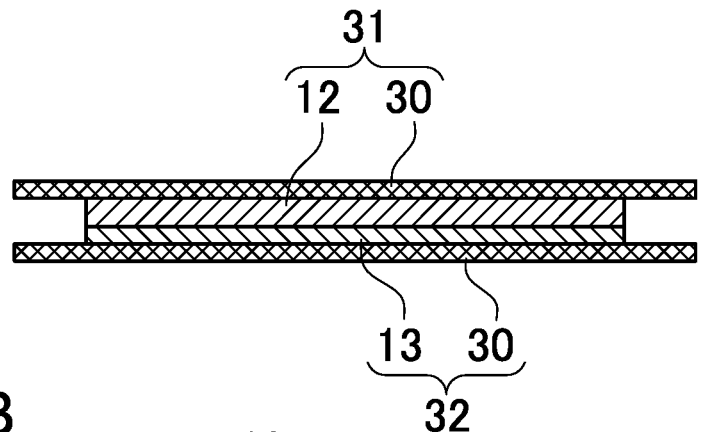
FIGS. 9A to 9D are enlarged schematic sectional view showing an example process of manufacturing a light emitting element unit according to an embodiment of the present disclosure.
Figure 9B:
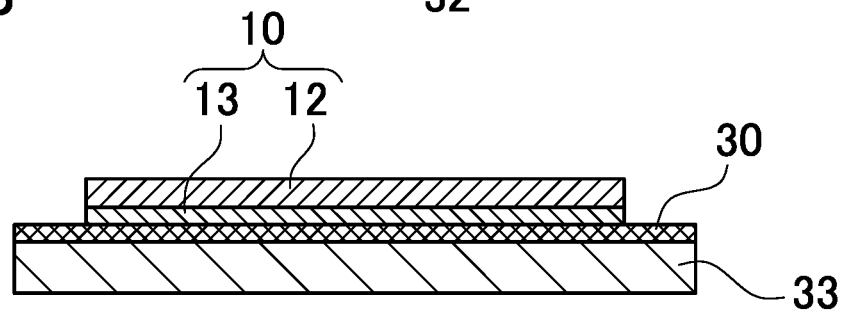

In the steps shown in FIGS. 9A and 9B, the wavelength conversion portion 12 and the light diffusion portion 13 are stacked to form the light adjustment portion 10.

In the step shown in FIG. 9A, a first sheet 31 obtained by attaching the wavelength conversion portion 12 to a surface of a base sheet 30 with a uniform thickness, and a second sheet 32 obtained by attaching the light diffusion portion 13 to a surface of the base sheet 30 with a uniform thickness are stacked with the wavelength conversion portion 12 bonded to the light diffusion portion 13. The wavelength conversion portion 12 is bonded to the light diffusion portion 13 with a light-transmissive bonding member. The wavelength conversion portion 12 and the light diffusion portion 13 are detachably attached to the base sheet 30 with, for example, an adhesive layer interposed between them.

Further, in the step shown in FIG. 9B, the base sheet 30 of the second sheet 32 is detachably attached to a plate 33, and the base sheet 30 bonded to the wavelength conversion portion 12 of the first sheet 31 is separated.

Figure 9C:
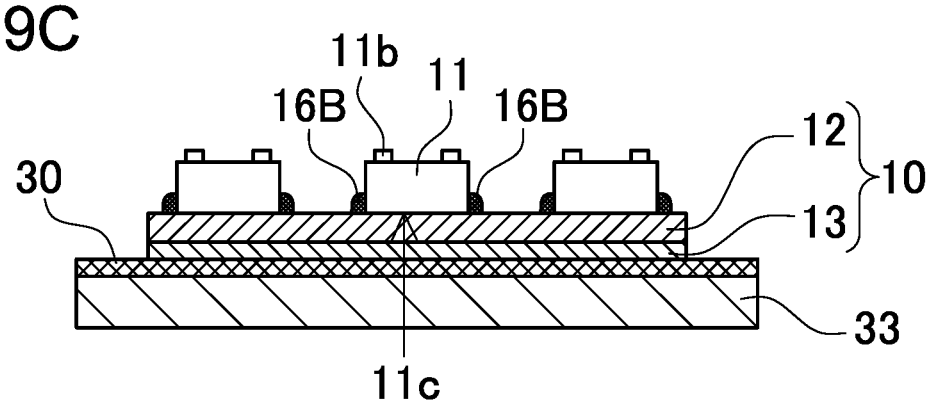

In the step shown in FIG. 9C, the light emitting element 11 is bonded to the light adjustment portion 10. The light emitting element 11 is bonded to the light adjustment portion 10 with the light emission surface 11c of the light emitting element 11 facing the light adjustment portion 10. The light emitting element 11 is bonded to the wavelength conversion portion 12 of the light adjustment portion 10 at a predetermined interval. Light emitting elements 11 are bonded to the light adjustment portion 10 with a light-transmissive bonding member interposed therebetween. The light-transmissive bonding member is applied to a surface of the light adjustment portion 10 or a surface of the light emitting element 11 to bond the light emitting element 11 to the light adjustment portion 10. FIG. 9C shows a state in which an applied light-transmissive bonding member 16B sticks out to the periphery of the light emitting element 11 to bond the light emitting element 11 to the light adjustment portion 10. The intervals between light emitting elements 11 can be determined to such a dimension that the outline of the light adjustment portion 10 has a predetermined size after cutting regions between light emitting elements 11 as shown in FIG. 10D. This is because the intervals between light emitting elements 11 determine the outline of the light adjustment portion 10.

Figure 9D:
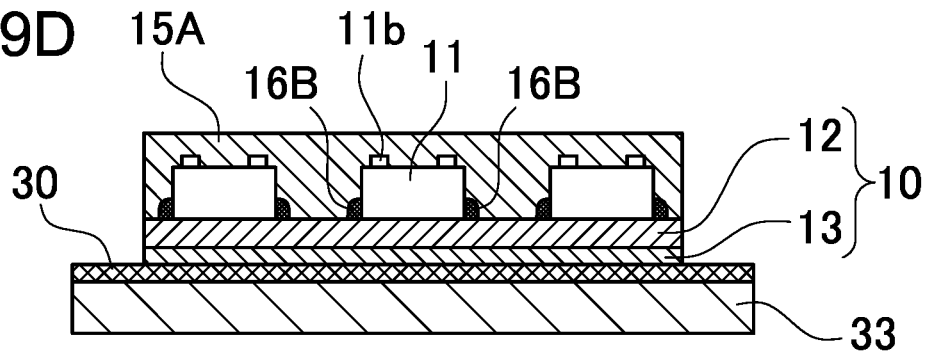

In the step shown in FIG. 9D, the first encapsulating resin 15A is formed so as to embed the light emitting element 11. The first encapsulating resin 15A is preferably formed using a white resin. The first encapsulating resin 15A formed using a white resin is supplied to a surface of the light adjustment portion 10, and cured with the light emitting element 11 embedded therein. The first encapsulating resin 15A is supplied with such a thickness that the light emitting element 11 is fully embedded. In the drawing, the first encapsulating resin 15A is supplied with such a thickness that the electrodes 11b of the light emitting element 11 are embedded.

Figure 10A:
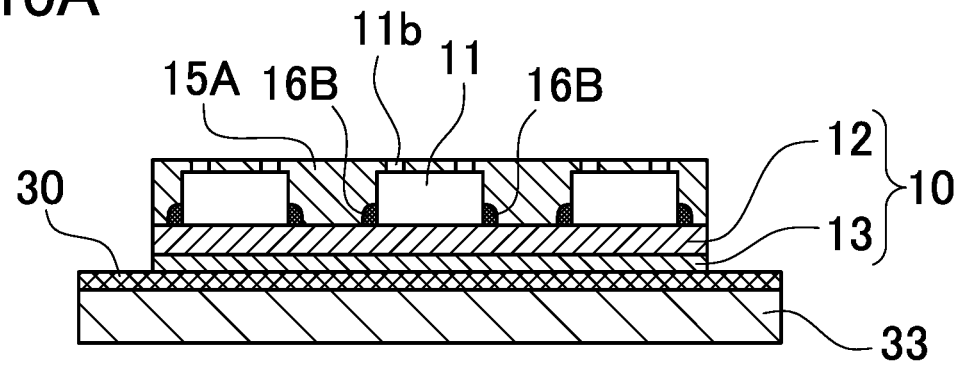
FIGS. 10A to 10D are enlarged schematic sectional view showing an example process of manufacturing a light emitting element unit according to an embodiment of the present disclosure.
Figure 10B:
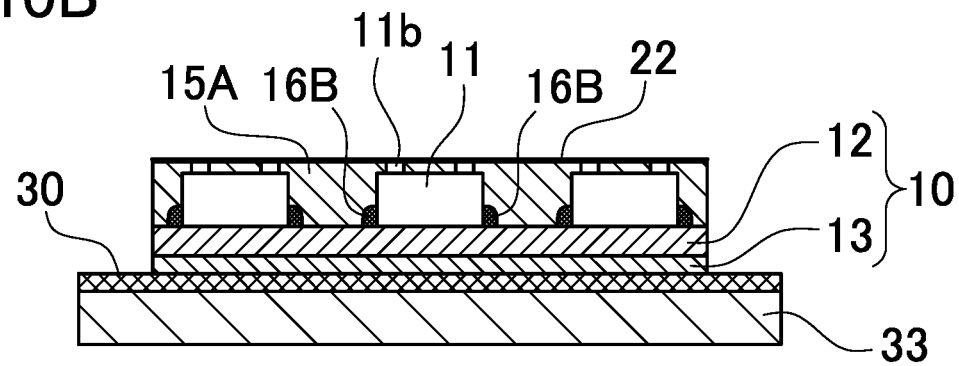

In the step shown in FIG. 10A, the cured white resin is polished to expose the electrode 11b of the light emitting element 11.

Electrode terminals 23 may be formed on the electrodes 11b of the light emitting element 11 using a metal film. In this case, for example, in the step shown in FIG. 10B, a metal film 22 is provided on a surface of the first encapsulating resin 15A. The metal film 22 can be formed, for example, by providing a metal film of copper, nickel, gold or the like on a surface of the first encapsulating resin 15A, by sputtering or the like, and connected to the electrode 11b.

Figure 10C:
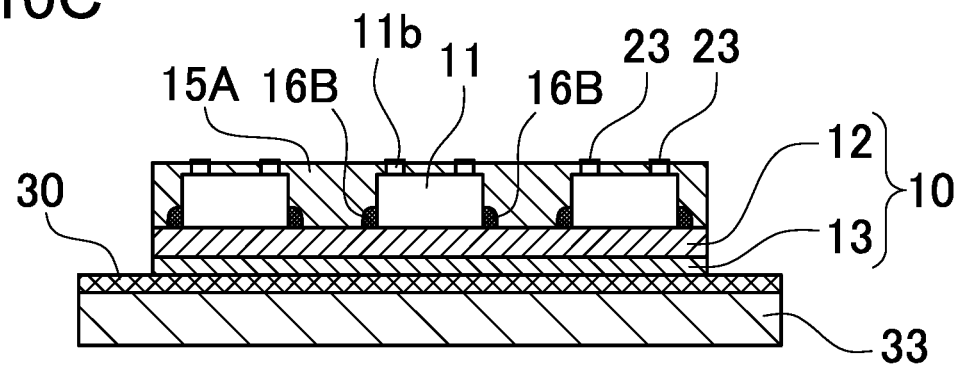
Figure 10D:
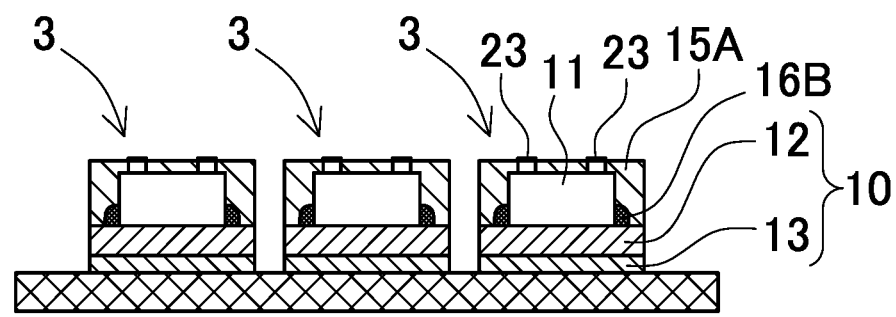

In the step shown in FIG. 10C, a part of the metal film 22 is removed such that the remaining parts of the metal film 22 are formed on the electrodes 11b to serve as the electrode terminal 23 for the light emitting element unit 3. Removal of the metal film 22 can be performed by dry etching, wet etching, laser ablation or the like.

In the step shown in FIG. 10D, the first encapsulating resin 15A formed using a white resin and a layer to be the light adjustment portion 10 are cut, and separated into the individual light emitting element units 3. In each of the separated light emitting element units 3, the light emitting element 11 is bonded to the light adjustment portion 10, the first encapsulating resin 15A is provided on the periphery of the light emitting element 11, and the electrode terminals 23 are exposed from a surface of the first encapsulating resin 15A.

The light emitting element units 3 manufactured in the above steps are bonded to the recesses 1b of the light guiding plate in the steps shown in FIGS. 11A to 11C and 12A to 12C.

Figure 11A:
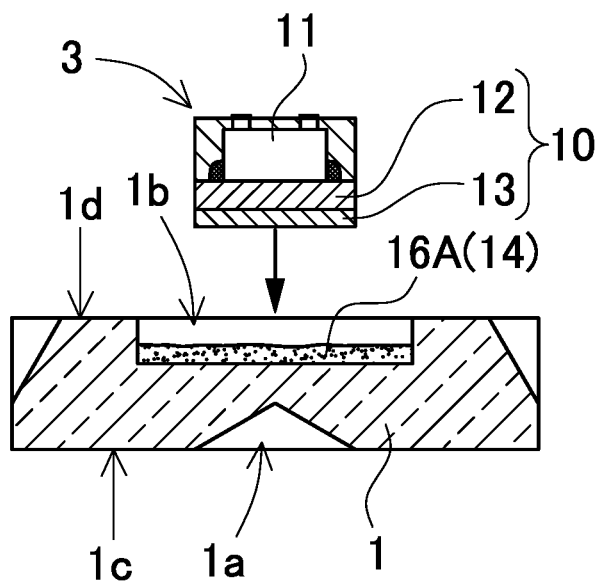
FIGS. 11A to 11C are enlarged schematic sectional view showing one example process of manufacturing a light emitting module according to the embodiment.
Figure 11B:
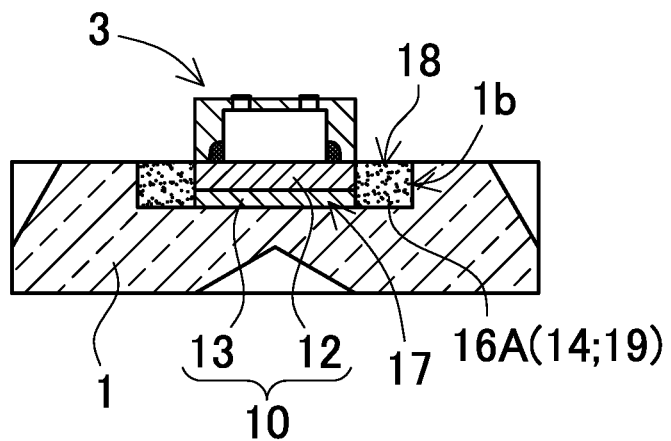

The light guiding plate 1 is formed using polycarbonate. As shown in FIGS. 11A and 11B, the light guiding plate 1 is formed by molding a thermoplastic resin such as polycarbonate, forming the recess 1b on the second main surface 1d, and providing the inverted cone-shaped optically functional portion 1a on the first main surface 1c. The light emitting element unit 3 is bonded to the recess 1b of the light guiding plate 1. The light emitting element unit 3 is bonded to the light guiding plate 1 by inserting the light adjustment portion 10 into the recess 1b in which the liquid light-transmissive bonding member 16A is supplied in an uncured state, and curing the light-transmissive bonding member 16A. The light emitting element unit 3 is bonded to the light guiding plate 1 by inserting the light adjustment portion 10 accurately to the center of the recess 1b, and curing the light-transmissive bonding member 16A. The amount of the uncured light-transmissive bonding member 16A to be applied to the recess 1b may be adjusted such that the light-transmissive bonding member 16A is forced out into the ring gap 18 to make the surface of the bonding wall 19 substantially flush with the second main surface 1d of the light guiding plate 1 at the time of bonding the light emitting element unit 3 to the light guiding plate 1. Alternatively, filling the ring gap 18 with the uncured light-transmissive bonding member can be performed after the light emitting element units 3 are bonded to the light guiding plate 1, and in this case also the surface of the bonding wall 19 can be flush with the second main surface 1d of the light guiding plate 1. Therefore, the amount of the uncured light-transmissive boding member 16A initially supplied into the recess 1b before bonding the light emitting element unit 3 to the recess 1b is such an amount that the surface of the bonding wall 19 is positioned lower than the second main surface 1d of the light guiding plate 1, in other words, such a small amount that the surface of the light-transmissive bonding member 16A is positioned within the ring gap 18. Then the light emitting element unit 3 is bonded to the light guiding plate 1, thereafter the light-transmissive bonding member is supplied into the ring gap 18 to make the surface of the bonding wall 19 substantially flush with the of the second main surface 1d of the light guiding plate 1.

The light-transmissive bonding member 16A that bonds the light adjustment portion 10 to the bottom of the recess 1b is in contact with the surfaces of the light adjustment portion 10 and the bottom of the recess 1b, and cured to bond the surface of the light adjustment portion 10 to the bottom of the recess 1b. Further, the light-transmissive bonding member 16A forced out from a gap between the light adjustment portion 10 and the bottom of the recess 1b forms the bonding wall 19, so that the outer lateral surfaces of the light adjustment portion 10 is bonded to the inner lateral surfaces of the recess 1b. In this manufacturing method, the uncured liquid light-transmissive bonding member 16A filling the recess 1b is forced out into the ring gap 18 to form the bonding wall 19. Also, the light-transmissive bonding member 16A filling the recess 1b is used as the bonding agent 14, and therefore the filling amount of the light-transmissive bonding member 16A needs to be adjusted so that the bonding wall 19 is substantially flush with the second main surface 1d of the light guiding plate 1. When the filling amount of the light-transmissive bonding member 16A is small, the surface of the bonding wall 19 is positioned lower than the second main surface 1d of the light guiding plate 1 as shown in FIG. 7. Conversely, when the filling amount of the light-transmissive bonding member 16A is large, the bonding wall 19 runs out from the ring gap 18, so that the surface of the bonding wall 19 protrudes from the second main surface 1d of the light guiding plate 1 as shown in FIG. 8. When the surface of the bonding wall 19 is not flush with the second main surface 1d of the light guiding plate 1, light distribution on the periphery of a light emitting portion is less likely to be desirable. This is because the light-transmissive bonding member running out from the recess 1*b* or a gap that is not filled with the light-transmissive bonding member causes undesirable light distribution. The filling amount of the light-transmissive bonding member 16A is adjusted so that the bonding wall 19 is substantially flush with the second main surface 1*d* of the light guiding plate 1, because a slightly uneven filling amount causes deviation of relative positions of the bonding wall 19 and the second main surface 1*d* of the light guiding plate 1.

In the light emitting module 100 of this embodiment, the volume of the bonding wall 19 is larger than a partial volumetric capacity in the recess, which is defined as a partial volume of the light emitting element unit 3 disposed or overlapped in the recess 1*b*. Therefore the partial volumetric capacity in the recess 1*b* is substantially the same as the volume of the light adjustment portion 10 of the light emitting element unit 3, since the light adjustment portion 10 is dipped in the bonding agent 14 thus the light adjustment portion 10 of the light emitting element unit 3 is positioned in the recess 1*b* as shown in FIG. 11B. Such configuration can prevent or alleviate the deviation of relative position between the surface level of the bonding wall 19 and the second main surface 1*d* of the light guiding plate 1 caused by unevenness of the supplying amount of the light-transmissive bonding member 16A. Therefore, in this embodiment, the volume of the entire bonding wall 19 is larger than the volume of the light adjustment portion 10. By making the volumetric capacity of the bonding wall 19 being larger than that of the insertion portion 17, i.e., the light adjustment portion 10 of the light emitting element unit 3, it can reduce level difference of the surfaces of the bonding wall 19 to the second main surface 1*d* of the light guiding plate 1 caused by a variance in amount of the bonding agent 14 (to be the light-transmissive bonding member 16A) supplied in the recess 1*b*.

As a specific example, the inner surface outline of a recess is a quadrangular shape having a length of 0.6 mm on each side, with a depth of 0.2 mm, the outline of a light adjustment portion is a quadrangular shape having a length of 0.5 mm on each side, with a thickness of 0.2 mm, and the light adjustment portion is disposed inside the recess. In this case, the volumetric capacity inside the recess of the light emitting element unit is 0.05 mm$^3$, and the volume of the entire bonding wall 19 is 0.022 mm$^3$, so that the volume of the entire bonding wall 19 is about a half of the recess internal volume.

For maintaining the level difference of the surfaces of the bonding walls 19 within ±0.01 mm in this structure, the filling amount of the light-transmissive bonding member needs to be extremely accurately controlled to within ±0.0036 mm$^3$.

As a comparative example, the inner surface outline of the recess 1*b* is a quadrangular shape having a length of 1.0 mm on each side, with the same depth as that described above, the volumetric capacity inside the recess is likewise 0.05 mm$^3$, and therefore the volume of the entire bonding wall 19 is 0.15 mm$^3$ which is about 3 times the recess internal volume. Then for adjusting the level difference of the surface of the bonding wall 19 to within ±0.01 mm, tolerance of the filling amount of the light-transmissive bonding member may be within ±0.01 mm$^3$, which is about 2.8 times as large as that described above.

Thus, in the light emitting module 100, the volumetric capacity of the ring gap 18 is increased to increase the total volume of the bonding wall 19, even if the amount of the light-transmissive bonding member 16A supplied in the recess 1*b* is slightly different, the surfaces of the bonding walls 19 are likely to be even, whereby such surfaces are substantially flush with the surface of the second main surface 1*d* of the light guiding member 1. Further, the thick bonding wall 19 transmits light radiated from the light adjustment portion 10 before the light is guided to the light guiding plate 1, and therefore by a structure in which the thick bonding wall 19 different from the light guiding plate 1 is stacked between the light guiding plate 1 and the light adjustment portion 10, light is more uniformly dispersed, and exits to outside from the light guiding plate 1. The light emitting module can be manufactured by bonding the light emitting element units 3 to the recesses 1*b* respectively, supplying the light-transmissive bonding member 16A to form the bonding walls 19 having surfaces positioned lower than the second main surface 1*d* of the light guiding plate 1, thereafter supplying the light-transmissive bonding member 16A to form the bonding walls 19 having surfaces substantially flush with the second main surface 1*d* of the light guiding plate 1 accurately. In this manufacturing process also, even if the amount of the light-transmissive bonding member 16A supplied in the recess 1*b* is slightly different, the surface of the bonding walls 19 is likely to be even, whereas such surfaces are substantially flush with the surface of the second main surface 1*d* of the light guiding member 1.

Figure 11C:
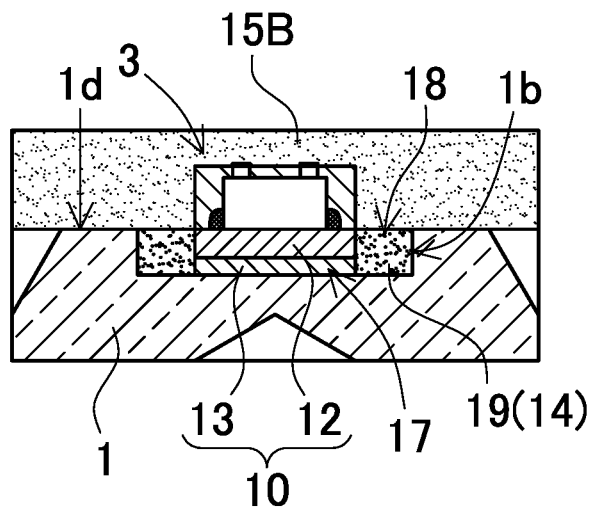

After the light emitting element unit 3 is bonded to the light guiding plate 1, the second encapsulating resin 15B is formed on the second main surface 1*d* of the light guiding plate 1 in the step shown in FIG. 11C. The second encapsulating resin 15B is formed using a white resin with such a thickness that the light emitting element unit 3 is embedded therein.

Figure 12A:
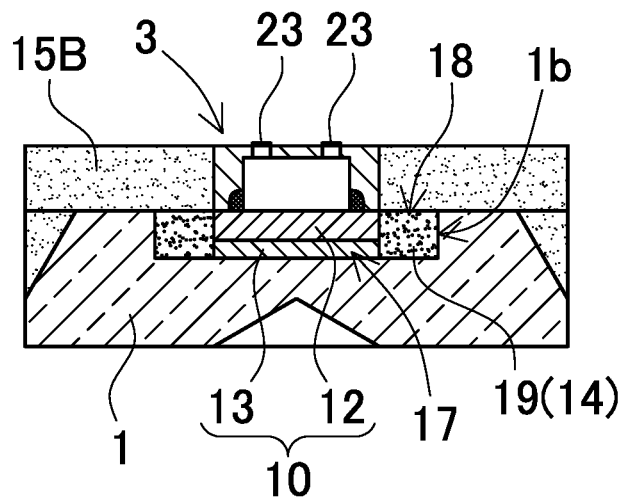
FIGS. 12A to 12C are an enlarged schematic sectional view showing an example process of manufacturing a light emitting module according to an embodiment of the present disclosure.

In the step shown in FIG. 12A, the surface of the cured second encapsulating resin 15B is polished to expose the electrode terminal 23 to the surface.

In the step shown in FIG. 11C, the second encapsulating resin 15B is formed with such a thickness that the light emitting element unit 3 is embedded therein, but the second encapsulating resin 15B can be formed with such a thickness that the surface of the second encapsulating resin 15B is flushes with the surfaces of the electrode terminals 23, or at a position lower than the surfaces of the electrode terminals 23, in order to omit the polishing step.

Figure 12B:
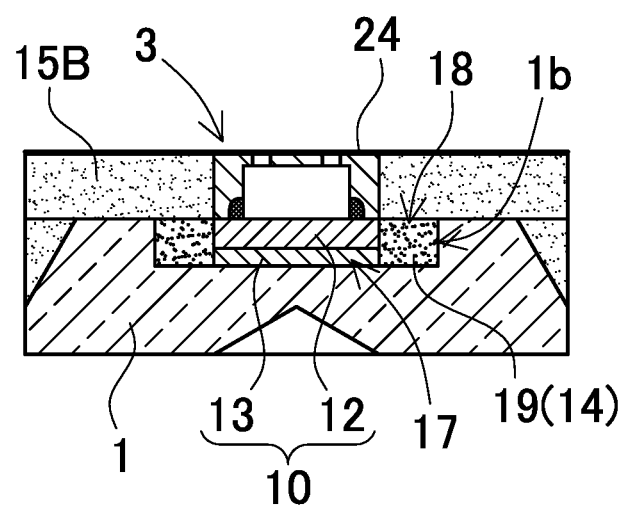

In the step shown in FIG. 12B, an electrically conductive film 24 is stacked on the surface of the encapsulating resin 15. In this step, a metal film 24 of Cu/Ni/Au is formed on substantially the entire surface of each of the electrode terminals 23 of the light emitting element 11 and the encapsulating resin 15 by sputtering.

Figure 12C:
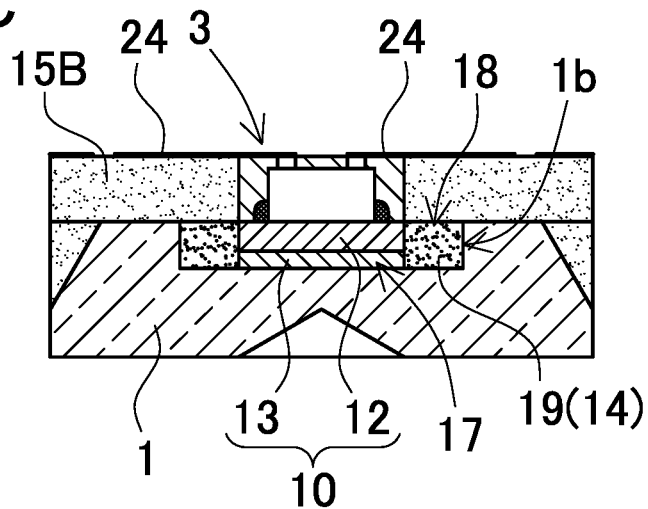

In the step shown in FIG. 12C, a part of the electrically conductive film 24 is removed, and each of the light emitting elements 11 is electrically connected through the electrically conductive film 24.

In the above steps, the light emitting module 100 is manufactured in which a plurality of light emitting element units 3 is bonded to one light guiding plate 1. The light emitting module including the light emitting bit 5 in which one light emitting element unit 3 is bonded to one light guiding plate 1' can be manufactured by: providing the light emitting element unit 3 as shown in FIGS. 9A to 9D and 10A to 10D; bonding the light emitting element unit 3 to one recess 1*b* of the light guiding plate 1 in the steps shown in FIGS. 11A and 11B; bonding the second encapsulating resin 15B to the light guiding plate 1 in the step shown in FIG. 11C; polishing the surface of the second encapsulating resin 15B to expose the electrode terminals 23 in the step shown in FIG. 12A; stacking the electrically conductive film 24 in the step shown in FIG. 12B; and removing part of the electrically conductive film 24 to allow the separated electrically conductive film 24 to be individually provided on the electrode terminals 23, thereby electrically connecting the separated electrically conductive film 24 to the electrode terminals 23 in the step shown in FIG. 12C.

A plurality of light emitting element units 3 may be connected by wiring so as to be driven independently of one another. The light emitting module may include a plurality of light emitting element unit groups, where the light guiding plate 1 is divided into a plurality of areas, a plurality of light emitting element units 3 mounted within one area is put into one group, and a plurality of light emitting element units 3 in the group is electrically connected to one another in series or in parallel, and connected to the same circuit. By arranging light emitting element units into groups as described above, a light emitting module capable of local dimming can be obtained.

One light emitting module 100 of this embodiment may be used as a backlight for one liquid crystal display device. Alternatively, a plurality of light emitting modules 100 may be arranged, and used as a backlight for one liquid crystal display device 1000. When a plurality of small light emitting modules 100 is provided, and each subjected to inspection or the like, the yield can be improved as compared to a case where the large light emitting module 100 having a large number of light emitting elements 11 mounted thereon is prepared.

Figure 13:
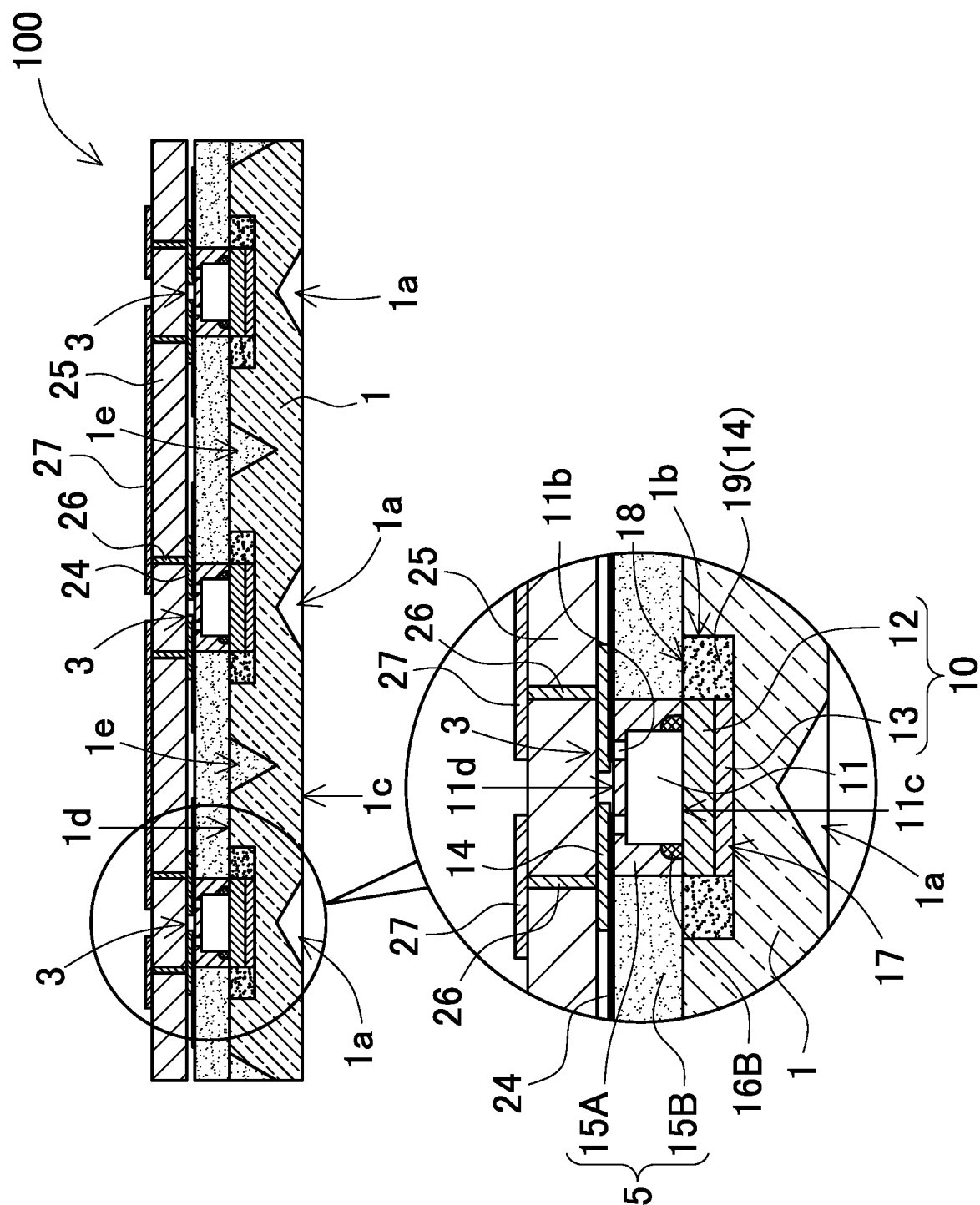
FIG. 13 is an enlarged schematic sectional view showing an example in which a circuit board is connected to the light emitting module shown in FIG. 3.

The light emitting module 100 may include a wiring substrate 25 as shown in FIG. 13. The wiring substrate 25 is provided with, for example, an electrically conductive member 26 covering a plurality of via holes provided on an insulating base member, and a wiring layer 27 electrically connected to the electrically conductive member 26 at both main surfaces of the base member. The electrodes 11b are electrically connected to the wiring layer 27 via the electrically conductive member 26.

One light emitting module 100 may be bonded to one wiring substrate. Alternatively, a plurality of light emitting modules 100 may be bonded to one wiring substrate. Accordingly, terminal electrodes for electrical connection to the outside (e.g. connectors) can be integrated, in other words, it is not necessary to prepare terminal electrodes for each light emitting module, and therefore the structure of the liquid crystal display device 1000 can be simplified.

Furthermore, a plurality of wiring substrates, each of which is bonded to a plurality of light emitting modules 100, may be arranged, and used as a backlight for one liquid crystal display device 1000. In this case, for example, a plurality of wiring substrates can be placed on a frame or the like, and each connected to an external power source using a connector or the like.

A light-transmissive member having a function of light diffusion or the like may be further stacked on the light guiding plate 1. In this case, when the optically functional portion 1a is a hollow, the opening (i.e., a portion close to the first main surface 1c of the light guiding plate 1) of the hollow is closed, or a light-transmissive member is provided without filling the hollow. Accordingly, a layer of air can be provided in the hollow of the optically functional portion 1a, so that light from the light emitting element 11 can be favorably spread.

The light emitting module according to the present disclosure can be used as, for example, a backlight for a liquid crystal display device, lighting equipment or the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A method of manufacturing a light emitting module, the method comprising:
   providing a light guiding plate having a first main surface serving as a light emitting surface, and a second main surface opposite to the first main surface, the second main surface defining a recess thereon, and a light emitting element unit comprising a light emitting element having a light emission surface and comprising an electrode, and a light adjustment portion containing a fluorescent material, the light emitting element being integrally bonded to the light adjustment portion;
   fixing the light emitting element unit to the light guiding plate by bonding the light adjustment portion to the recess; and
   forming wiring on the electrode of the light emitting element;
   wherein the light adjustment portion containing fluorescent material and the light emitting element are disclosed in order from a bottom surface of the recess.

2. The method according to claim 1,
   wherein the recess formed on the second main surface comprises a plurality of recesses,
   wherein the light emitting element unit comprises a plurality of light emitting element units, and
   wherein the plurality of light emitting element units are each bonded to the plurality of recesses of the light guiding plate to bond the plurality of light emitting element units at predetermined positions on the light guiding plate.

3. The method according to claim 1, wherein in fixing the light emitting element unit to the light guiding plate, the light emission surface of the light emitting element is flush with the second main surface of the light guiding plate.

4. The method according to claim 3, further comprising:
   forming a bonding wall with a bonding agent supplied in a ring gap formed between inner lateral surfaces of the recess and outer lateral surfaces of an insertion portion of the light emitting element unit disposed in the recess, the insertion portion having an outline smaller than an inner surface outline of the recess.

5. The method according to claim 4, wherein a volumetric capacity of the ring gap is larger than a volume of the insertion portion of the light emitting element unit.

6. The method according to claim 4, wherein a surface of the bonding wall is substantially flush with the second main surface of the light guiding plate.

7. The method according to claim 4, wherein the bonding agent is a light-transmissive resin.

8. The method according to claim 1,
   wherein the light emitting element unit is provided with a first encapsulating resin which has outer lateral surfaces flush with the outer lateral surfaces of the light adjustment portion, the first encapsulating resin embedding the light emitting element, and
   wherein the light emitting element unit provided with the first encapsulating resin is bonded to the light guiding plate.

9. The method according to claim 8, wherein the first encapsulating resin includes a white resin.

10. The method according to claim 1, wherein in fixing the light emitting element unit to the light guiding plate, a second encapsulating resin for embedding the light emitting element unit is provided on the second main surface of the light guiding plate to which the light emitting element unit is bonded.

11. The method according to claim 1, wherein the light emitting element unit is disposed so that the light emission surface of the light emitting element is opposite to a bottom surface of the recess.

12. The method according to claim 1, wherein at least a portion of the light emitting element unit is positioned outside of the recess.

* * * * *